US007439086B2

(12) United States Patent
Yamazaki et al.

(10) Patent No.: US 7,439,086 B2
(45) Date of Patent: Oct. 21, 2008

(54) METHOD FOR MANUFACTURING LIQUID CRYSTAL DISPLAY DEVICE

(75) Inventors: Shunpei Yamazaki, Tokyo (JP); Shinji Maekawa, Shizuoka (JP); Osamu Nakamura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 172 days.

(21) Appl. No.: 10/576,641

(22) PCT Filed: Nov. 5, 2004

(86) PCT No.: PCT/JP2004/016796

§ 371 (c)(1),
(2), (4) Date: Apr. 21, 2006

(87) PCT Pub. No.: WO2005/048353

PCT Pub. Date: May 26, 2005

(65) Prior Publication Data

US 2007/0082443 A1      Apr. 12, 2007

(30) Foreign Application Priority Data

Nov. 14, 2003    (JP) .............................. 2003-385999

(51) Int. Cl.
*H01L 21/00*    (2006.01)
(52) U.S. Cl. ........................... 438/30; 438/22; 438/478; 257/E27.131
(58) Field of Classification Search .................. 438/30, 438/22, 478; 257/E27.131
See application file for complete search history.

(56) References Cited

U.S. PATENT DOCUMENTS

| 5,162,901 A | 11/1992 | Shimada et al. |
| 5,598,285 A | 1/1997 | Kondo et al. |
| 5,640,067 A | 6/1997 | Yamauchi et al. |
| 5,737,051 A | 4/1998 | Kondo et al. |

(Continued)

FOREIGN PATENT DOCUMENTS

EP            0 399 846 A2    11/1990

(Continued)

OTHER PUBLICATIONS

International Search Report of Application No. PCT/JP2004/016796; PCT7502) Dated Feb. 8, 2005.

(Continued)

*Primary Examiner*—Walter Lindsay, Jr.
*Assistant Examiner*—Abdulfattah Mustapha
(74) *Attorney, Agent, or Firm*—Nixon Peabody LLP; Jeffrey L. Costellia

(57) ABSTRACT

A conventionally followed technique of manufacturing a liquid crystal display device is a method for forming various types of coatings over an entire surface of a substrate and for removing the coatings with a small region left by etching, which requires wasting a material cost and treating a large quantity of waste. A liquid crystal display device is manufactured by forming at least one or more of patterns necessary for manufacturing a liquid crystal display device by a method capable of selectively forming a pattern. A droplet discharge method capable of forming a predetermined pattern by selectively discharging a droplet of a composition prepared for a specific purpose is employed as the method capable of selectively forming a pattern.

9 Claims, 39 Drawing Sheets

U.S. PATENT DOCUMENTS

| | | |
|---|---|---|
| 5,897,328 A | 4/1999 | Yamauchi et al. |
| 5,989,945 A | 11/1999 | Yudasaka et al. |
| 6,090,489 A | 7/2000 | Hayakawa et al. |
| 6,124,915 A | 9/2000 | Kondo et al. |
| 6,291,136 B1 | 9/2001 | Masutani et al. |
| 6,341,004 B1 | 1/2002 | Kondo et al. |
| 6,369,410 B1 | 4/2002 | Yamazaki et al. |
| 6,514,801 B1 | 2/2003 | Yudasaka et al. |
| 6,593,591 B2 | 7/2003 | Yudasaka et al. |
| 6,613,614 B2 | 9/2003 | Yamazaki et al. |
| 6,724,455 B2 | 4/2004 | Kondo et al. |
| 6,734,029 B2 | 5/2004 | Furusawa |
| 6,833,225 B2 | 12/2004 | Ooishi |
| 6,846,616 B2 | 1/2005 | Kobayashi et al. |
| 6,849,308 B1 | 2/2005 | Speakman et al. |
| 6,853,083 B1 | 2/2005 | Yamauchi et al. |
| 6,992,435 B2 | 1/2006 | Yamauchi et al. |
| 7,119,026 B2 | 10/2006 | Honda et al. |
| 7,205,096 B2 | 4/2007 | Park et al. |
| 2002/0044111 A1 | 4/2002 | Yamazaki et al. |
| 2002/0056838 A1 | 5/2002 | Ogawa |
| 2002/0063822 A1 | 5/2002 | Kondo et al. |
| 2002/0074547 A1 | 6/2002 | Yudasaka et al. |
| 2002/0096681 A1 | 7/2002 | Yamazaki et al. |
| 2002/0100908 A1 | 8/2002 | Yudasaka et al. |
| 2002/0179906 A1 | 12/2002 | Yudasaka et al. |
| 2003/0054653 A1 | 3/2003 | Yamazaki et al. |
| 2003/0127974 A1* | 7/2003 | Miyazawa .................. 313/504 |
| 2003/0129321 A1 | 7/2003 | Aoki |
| 2003/0134519 A1 | 7/2003 | Yudasaka et al. |
| 2003/0203643 A1* | 10/2003 | Hasei et al. ................. 438/758 |
| 2003/0232128 A1 | 12/2003 | Furusawa et al. |
| 2004/0004221 A1* | 1/2004 | Murade ....................... 257/72 |
| 2004/0147113 A1 | 7/2004 | Yamazaki et al. |
| 2004/0189923 A1 | 9/2004 | Kondo et al. |
| 2004/0195569 A1* | 10/2004 | Hashimoto et al. ............. 257/69 |
| 2004/0207792 A1* | 10/2004 | Wu ............................. 349/141 |
| 2005/0029591 A1* | 2/2005 | Yudasaka et al. ............ 257/347 |
| 2005/0095356 A1 | 5/2005 | Nakamura et al. |
| 2005/0163938 A1 | 7/2005 | Yamazaki et al. |
| 2007/0051952 A1 | 3/2007 | Yamazaki et al. |
| 2007/0132377 A1 | 6/2007 | Yamazaki et al. |

FOREIGN PATENT DOCUMENTS

| | | |
|---|---|---|
| EP | 0588568 | 3/1994 |
| EP | 0 855 614 A1 | 7/1998 |
| EP | 0916992 | 5/1999 |
| EP | 1061404 | 12/2000 |
| EP | 1113502 | 7/2001 |
| EP | 1 209 748 | 5/2002 |
| EP | 1 163 552 B1 | 8/2003 |
| EP | 1 445 793 A2 | 8/2004 |
| EP | 1 450 412 A2 | 8/2004 |
| JP | 03-141325 | 6/1991 |
| JP | 04-056168 | 2/1992 |
| JP | 05-119351 | 5/1993 |
| JP | 06-273803 | 9/1994 |
| JP | 07-297404 | 11/1995 |
| JP | 08-330600 | 12/1996 |
| JP | 09-179142 | 7/1997 |
| JP | 09-260808 | 10/1997 |
| JP | 10-270843 | 10/1998 |
| JP | 11-251259 | 9/1999 |
| JP | 11-261076 | 9/1999 |
| JP | 11-326951 | 11/1999 |
| JP | 11-340129 | 12/1999 |
| JP | 2000-029053 | 1/2000 |
| JP | 2001-179167 | 7/2001 |
| JP | 2001-196590 | 7/2001 |
| JP | 2002-049333 | 2/2002 |
| JP | 2002-190598 | 7/2002 |
| JP | 2002-217421 | 8/2002 |
| JP | 2002-359246 | 12/2002 |
| JP | 2003-050405 | 2/2003 |
| JP | 2003-058077 | 2/2003 |
| JP | 2003-059940 | 2/2003 |
| JP | 2003-506886 | 2/2003 |
| JP | 2003-098548 | 4/2003 |
| JP | 2003-149831 | 5/2003 |
| JP | 2003-178872 | 6/2003 |
| JP | 2003-197612 | 7/2003 |
| JP | 2003-209339 | 7/2003 |
| JP | 2003-209340 | 7/2003 |
| JP | 2003-229579 | 8/2003 |
| JP | 2003-241177 | 8/2003 |
| JP | 2003-258226 | 9/2003 |
| JP | 2003-315813 | 11/2003 |
| WO | WO 97/43689 | 11/1997 |
| WO | WO-00/59040 | 10/2000 |
| WO | WO 01/11426 A1 | 2/2001 |

OTHER PUBLICATIONS

Written Opinion (Application No. PCT/JP2004/016796; PCT7502) Dated Feb. 9, 2005.

Partial International Search Report of Application No. PCT/JP2004/016796 Dated Dec. 21, 2004.

* cited by examiner

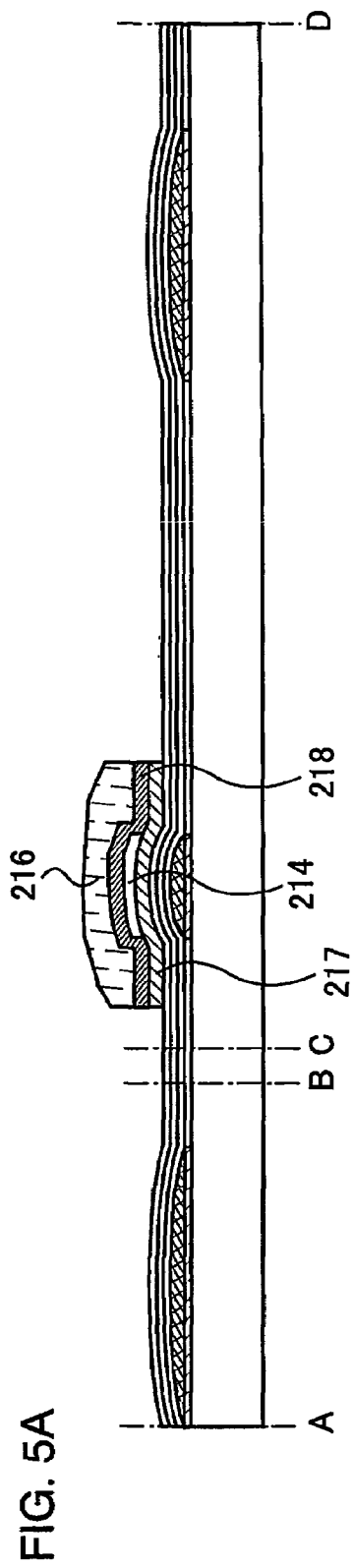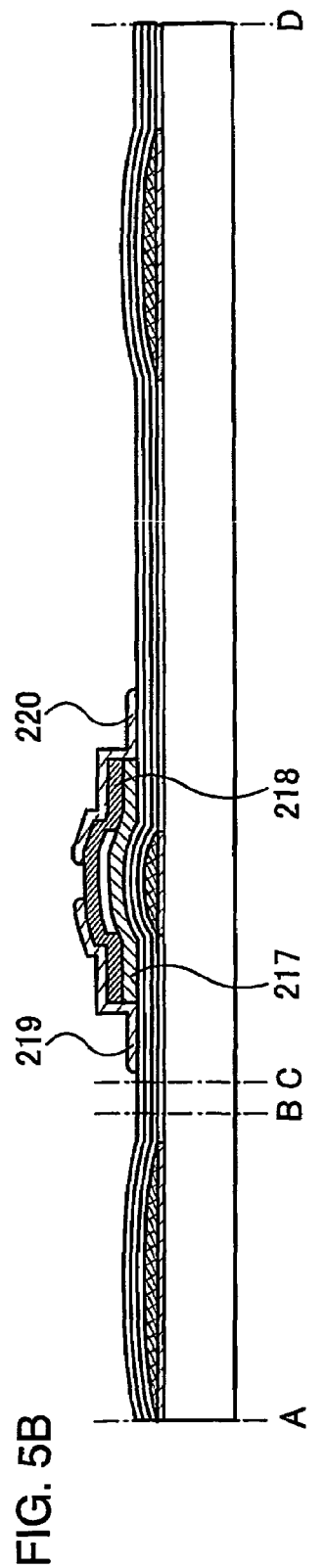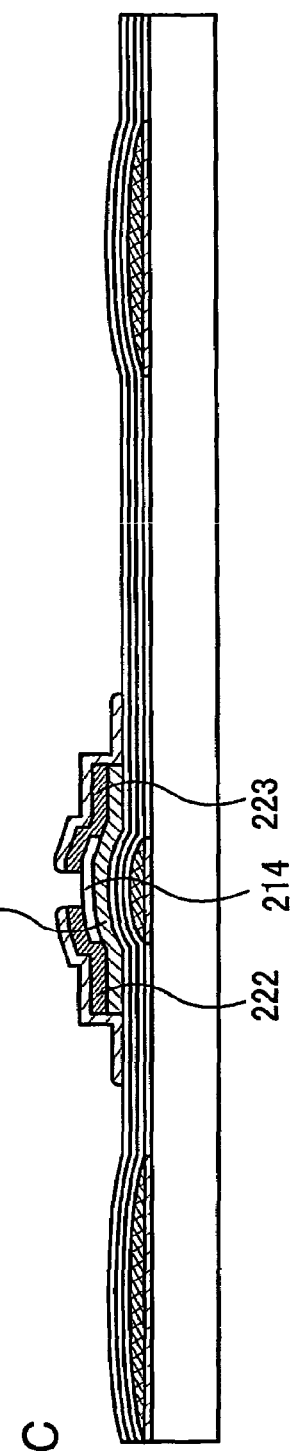

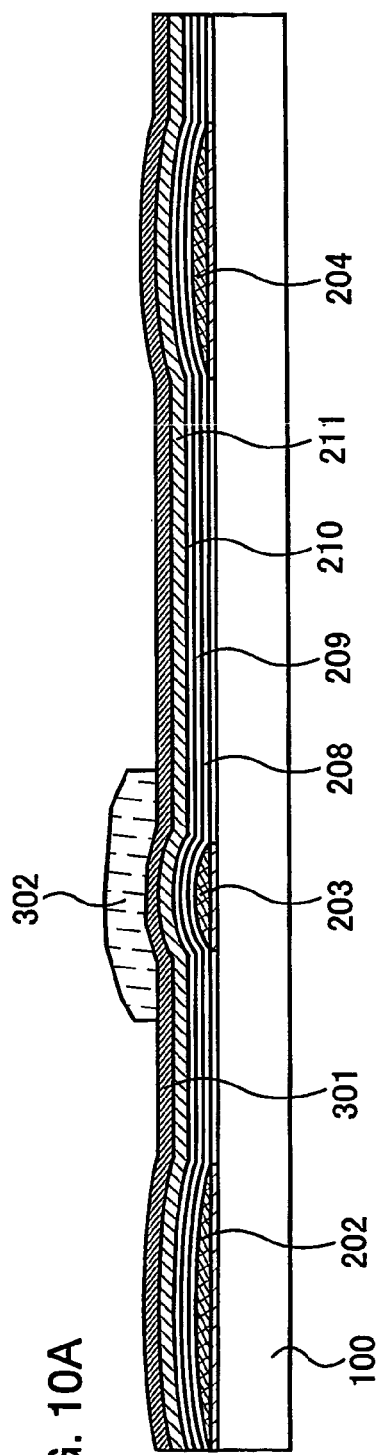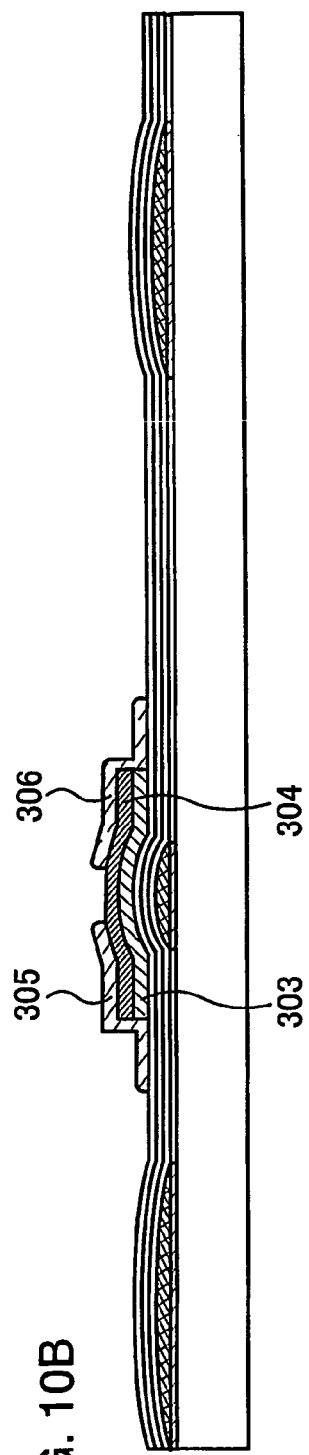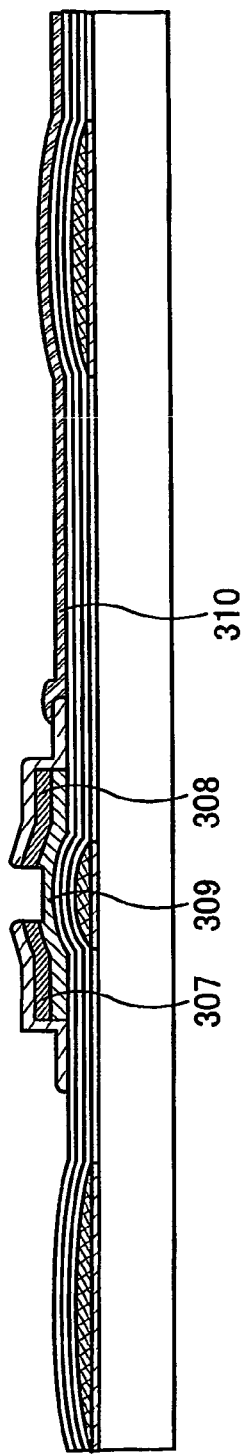
FIG. 10A
FIG. 10B
FIG. 10C

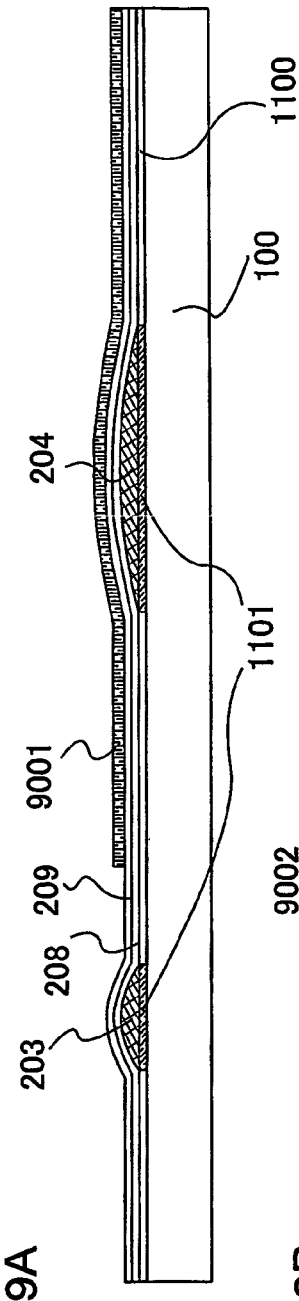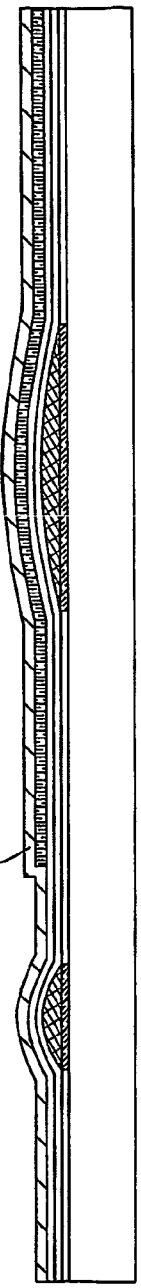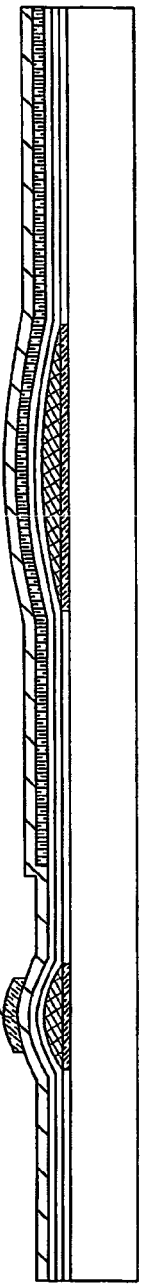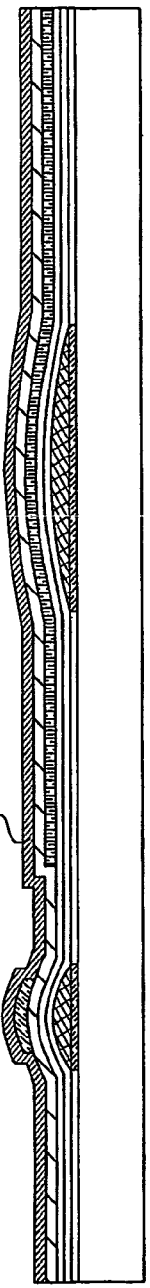

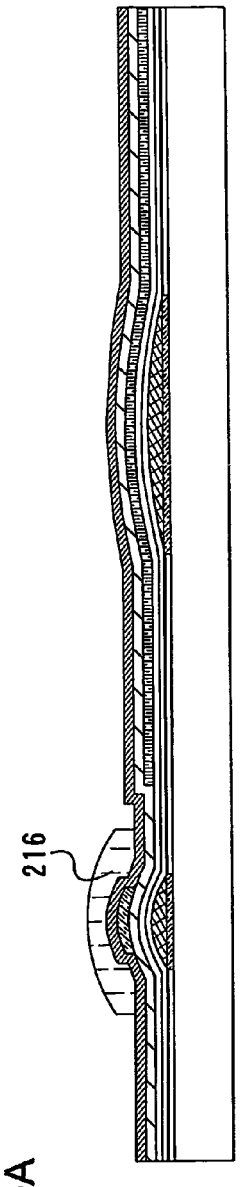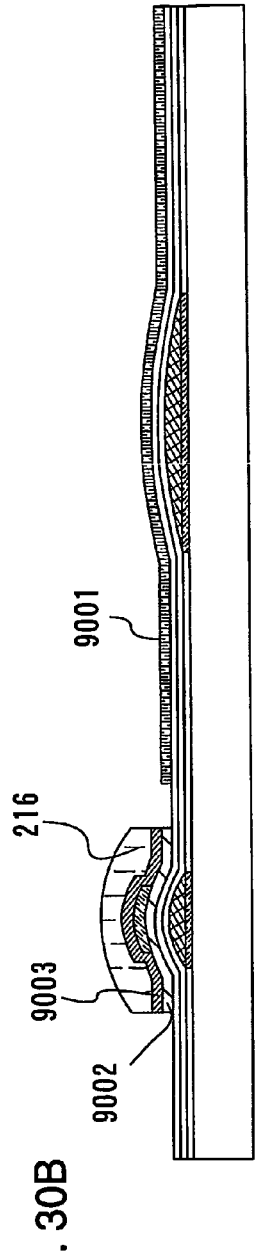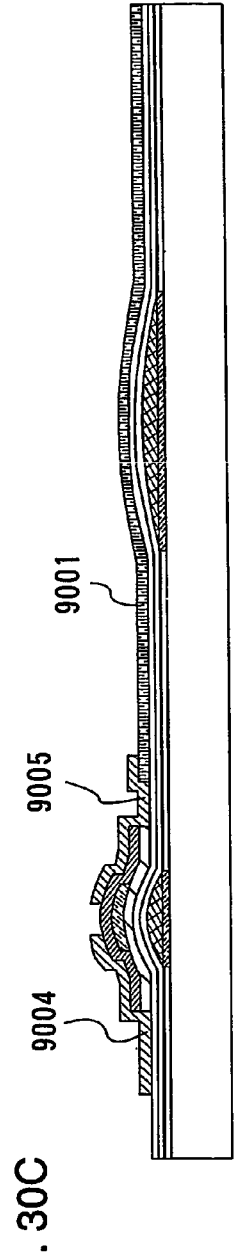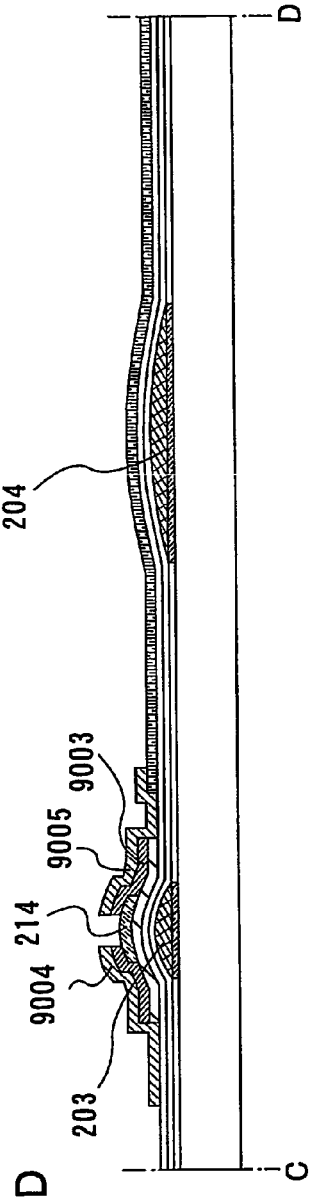
FIG. 30A
FIG. 30B
FIG. 30C
FIG. 30D

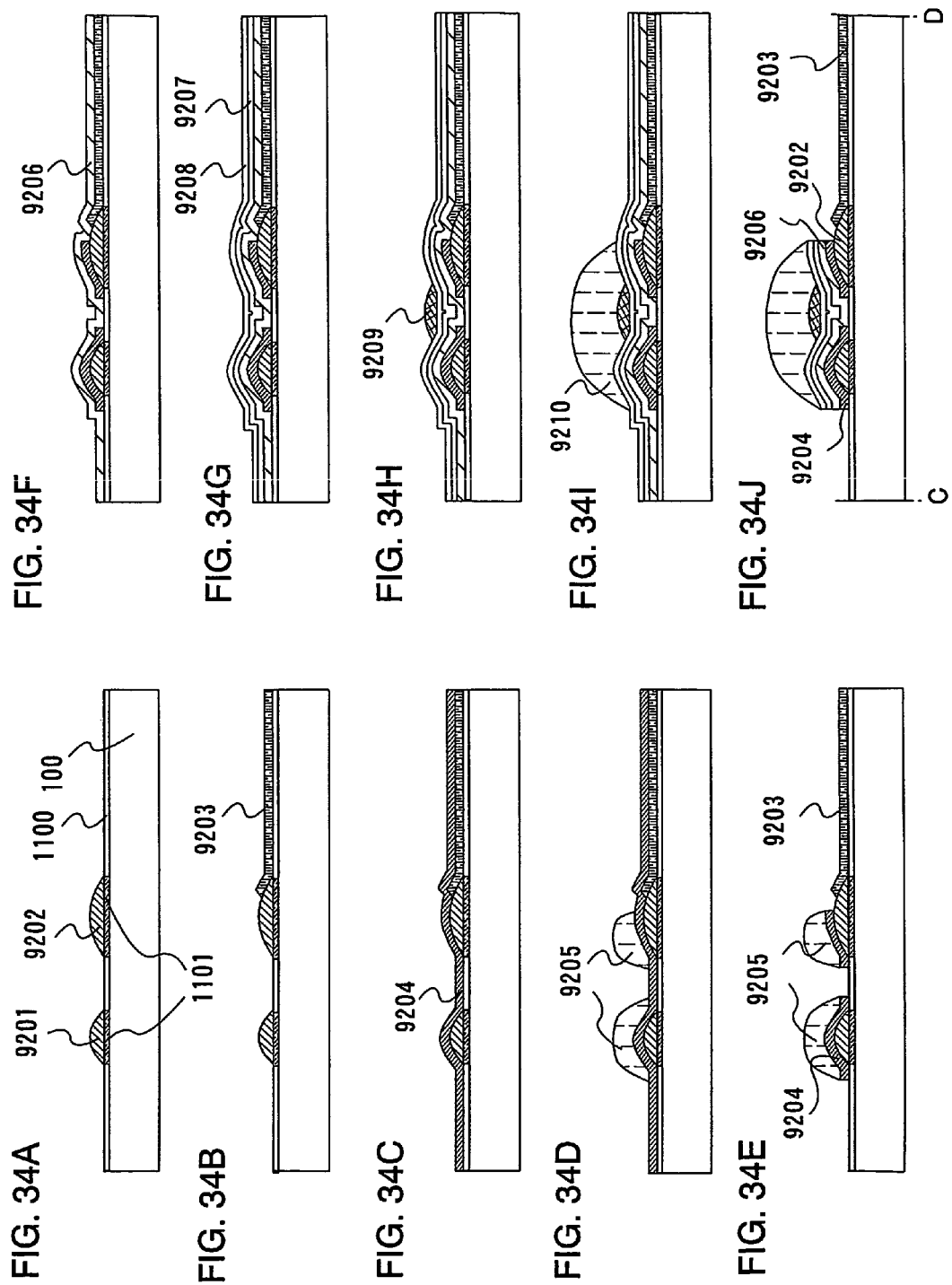

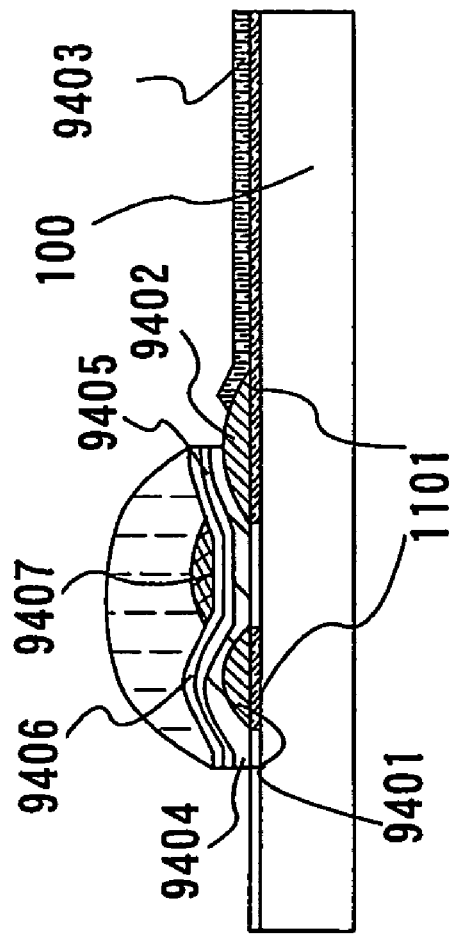
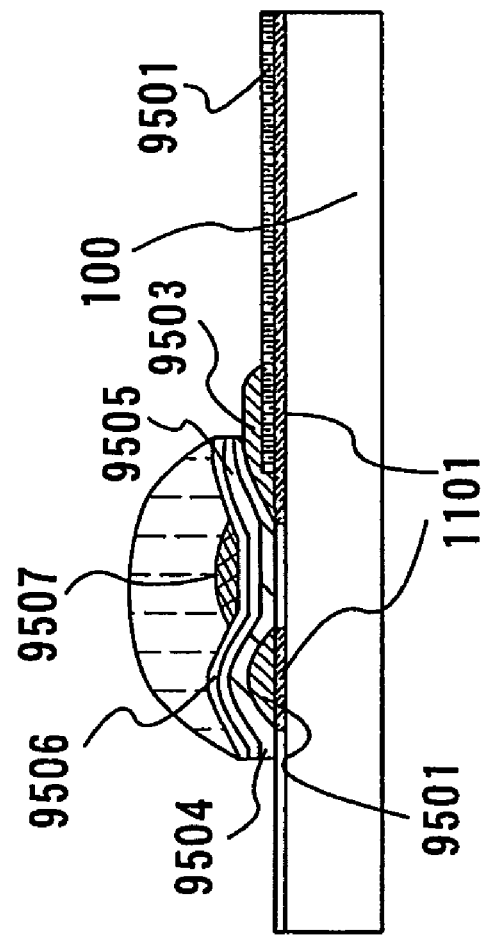
FIG. 36A
FIG. 36B

METHOD FOR MANUFACTURING LIQUID CRYSTAL DISPLAY DEVICE

TECHNICAL FIELD

The present invention relates to a liquid crystal display device including an active element such as a transistor formed over a large-area glass substrate and to a manufacturing method thereof.

BACKGROUND ART

Conventionally, a so-called active matrix liquid crystal display panel including a thin film transistor (hereinafter also referred to as a "TFT") over a glass substrate is manufactured by patterning various thin films through a light-exposure step using a photomask as in a manufacturing technique of a semiconductor integrated circuit.

A production technique for efficiently performing mass-production by cutting a plurality of liquid crystal display panels out of one mother glass substrate has been adopted so far. The size of a mother glass substrate has been enlarged from 300 mm×400 mm of the first generation in the early 1990s to 680 mm×880 mm or 730 mm×920 mm of the fourth generation in 2000. Furthermore, the production technique has progressed so that a large number of display panels can be obtained from one substrate.

When the size of a glass substrate or a display panel is small, patterning treatment can be performed comparatively easily by using a photolithography apparatus. However, as a substrate size is enlarged, an entire surface of a display panel cannot be simultaneously treated by performing light-exposure treatment once. Consequently, a method for exposing an entire surface of a substrate to light has been developed as a light-exposure treatment (for example, consecutive light-exposure to one substrate for connecting edges of elements such as a wiring, not to be disconnected at a boundary between the elements). This method is performed by dividing a region where a photoresist is applied into a plurality of block regions, performing light-exposure treatment on every predetermined block regions, and sequentially repeating the treatment (for example, Reference 1: Japanese Patent Laid-Open No. H11-326951).

DISCLOSURE OF INVENTION

However, a size of a glass substrate is further enlarged to 1000 mm×1200 mm or 1100 mm×1300 mm in the fifth generation, and a size of 1500 mm×1800 mm or more is assumed in the next generation. Therefore, it becomes difficult to manufacture a display panel at low cost with good productivity by a conventional patterning method. In other words, when a plurality of times of light-exposure treatment is performed by the above-described consecutive light exposure, a processing time is increased and huge investment is required for developing a photolithography apparatus that can treat a large-sized substrate.

Moreover, a method for forming various types of thin films over an entire surface of a substrate and for removing the thin films with a small region left by etching includes a problem that a material cost is wasted and a large quantity of waste is required to treat.

The present invention is made in view of the above situation, and it is an object of the present invention to provide a liquid crystal display device which can be manufactured with utilizing efficiency of a material improved and with a manufacturing step simplified and also a manufacturing technique thereof.

According to the present invention, at least one or more of patterns necessary for manufacturing a liquid crystal display device, such as a wiring layer, a conductive layer for forming an electrode, and a mask layer for forming a predetermined pattern, is formed by a method capable of selectively forming a pattern to manufacture a liquid crystal display device. A droplet discharge method (also referred to as an ink-jet method depending on its mode) capable of forming a predetermined pattern by selectively discharging a droplet of a composition prepared for a specific purpose is employed as a method capable of selectively forming a pattern to form a conductive layer, an insulating layer, or the like. When a conductive material is formed by a droplet discharge method, a conductive material with good adhesion can be formed by performing base treatment on a formation face. Note that the formation face means a face area where a composition discharged from a droplet discharge means is to be formed.

One feature of a method for manufacturing a liquid crystal display device according to the present invention, base treatment is performed on a formation face before a conductive material is formed by a droplet discharge method.

Another feature of a method for manufacturing a liquid crystal display device according to the present invention is that base treatment is performed on a conductive formation face before forming a film by a droplet discharge method.

A method for manufacturing a liquid crystal display device of the present invention comprises the steps of: forming a first electrode over a substrate having an insulating surface, forming a first insulating film to cover the first electrode, forming a first semiconductor layer over the first insulating film, forming a second insulating film over the first semiconductor layer to overlap the first electrode, forming an n-type second semiconductor layer to cover the second insulating film, pattering the first and second semiconductor layers into an island shape, forming second and third electrodes over the second semiconductor layer, etching the second semiconductor layer using the second and third electrode as a mask to be separated, and forming a fourth electrode to be in contact with the third electrode, wherein the electrode is formed by a droplet discharge method in the step of forming any one of the electrodes.

A method for manufacturing a liquid crystal display device comprises the steps of: forming a first electrode over a substrate having an insulating surface, forming a first insulating film to cover the first electrode, forming a second electrode over the first insulating film, forming a first semiconductor layer over the first insulating film and the second electrode, forming a second insulating film over the first semiconductor layer to overlap the first electrode, forming an n-type second semiconductor layer to cover the second insulating film, pattering the first and second semiconductor layers into an island shape, forming third and fourth electrodes over the second semiconductor layer, and etching the second semiconductor layer using the third and fourth electrodes as a mask to be separated, wherein the electrode is formed by a droplet discharge method in the step of forming any one of the electrodes.

A method for manufacturing a liquid crystal display device comprises the steps of: forming first and second electrodes over a substrate having an insulating surface; forming a third electrode to partially overlap the second electrode; forming an n-type first semiconductor layer over the first electrode, the second electrode, and the third electrode; separating the first semiconductor layer into a semiconductor layer in contact with the first electrode and a semiconductor layer in contact with the second electrode; forming a second semiconductor layer over the first semiconductor layer; forming an insulating film over the second semiconductor layer; forming a fourth electrode over the insulating film and over a region where the first semiconductor layer is separated; and patterning the second semiconductor layer and the insulating film into an island shape, wherein the electrode is formed by a droplet discharge method in the step of forming any one of the electrodes.

A method for manufacturing a liquid crystal display device comprises the steps of: forming a first electrode over a substrate having an insulating surface; forming a second electrode and a third electrode which partially overlaps the first electrode; forming an n-type first semiconductor layer over the first electrode, the second electrode, and the third electrode; separating the first semiconductor layer into a semiconductor layer in contact with the second electrode and a semiconductor layer in contact with the third electrode; forming a second semiconductor layer over the first semiconductor layer; forming an insulating film over the second semiconductor layer; forming a fourth electrode over the insulating film and over a region where the first semiconductor layer is separated; and patterning the second semiconductor layer and the insulating film into an island shape, wherein the electrode is formed by a droplet discharge method in the step of forming any one of the electrodes.

Another feature of a method for manufacturing a liquid crystal display device according to the present is that base treatment is performed on a formation face before an electrode is formed by a droplet discharge method.

Another feature of a method for manufacturing a liquid crystal display device according to the present is that base treatment is performed on an electrode before a film to be in contact with the electrode is formed by a droplet discharge method.

Another feature of a method for manufacturing a liquid crystal display device is that a substance having a photocatalytic function is formed on a formation face as base treatment and the substance having a photocatalytic function is selectively irradiated with light to be hydrophilic.

Another feature of a method for manufacturing a liquid crystal display device is that plasma treatment is performed as base treatment on a formation face to be liquid-repellent.

As described above, one feature of the invention is that a gate electrode layer, a wiring layer, and a mask utilized in pattering are formed by a droplet discharge method. At least one or more of patterns necessary for manufacturing a liquid crystal display device is/are formed by a method capable of selectively forming a pattern to manufacture a liquid crystal display device, thereby accomplishing its object.

According to the present invention, a wiring layer or a mask can be directly patterned by a droplet discharge method; therefore, it is possible to obtain a thin film transistor with utilization efficiency of a material improved and with a manufacturing step simplified, and a liquid crystal display device using the thin film transistor.

BRIEF DESCRIPTION OF DRAWINGS

FIGS. 5A to 5C are cross-sectional views showing a method for manufacturing a liquid crystal display device of the present invention.

FIGS. 10A to 10C are cross-sectional views showing a method for manufacturing a liquid crystal display device of the present invention.

FIGS. 29A to 29D are cross-sectional views showing a method for manufacturing a liquid crystal display device of the present invention.

FIGS. 30A to 30D are cross-sectional views showing a method for manufacturing a liquid crystal display device of the present invention.

FIGS. 34A to 34J are cross-sectional views showing a method for manufacturing a liquid crystal display device of the present invention.

FIGS. 36A and 36B are cross-sectional views showing a method for manufacturing a liquid crystal display device of the present invention.

BEST MODE FOR CARRYING OUT THE INVENTION

Figure 1:
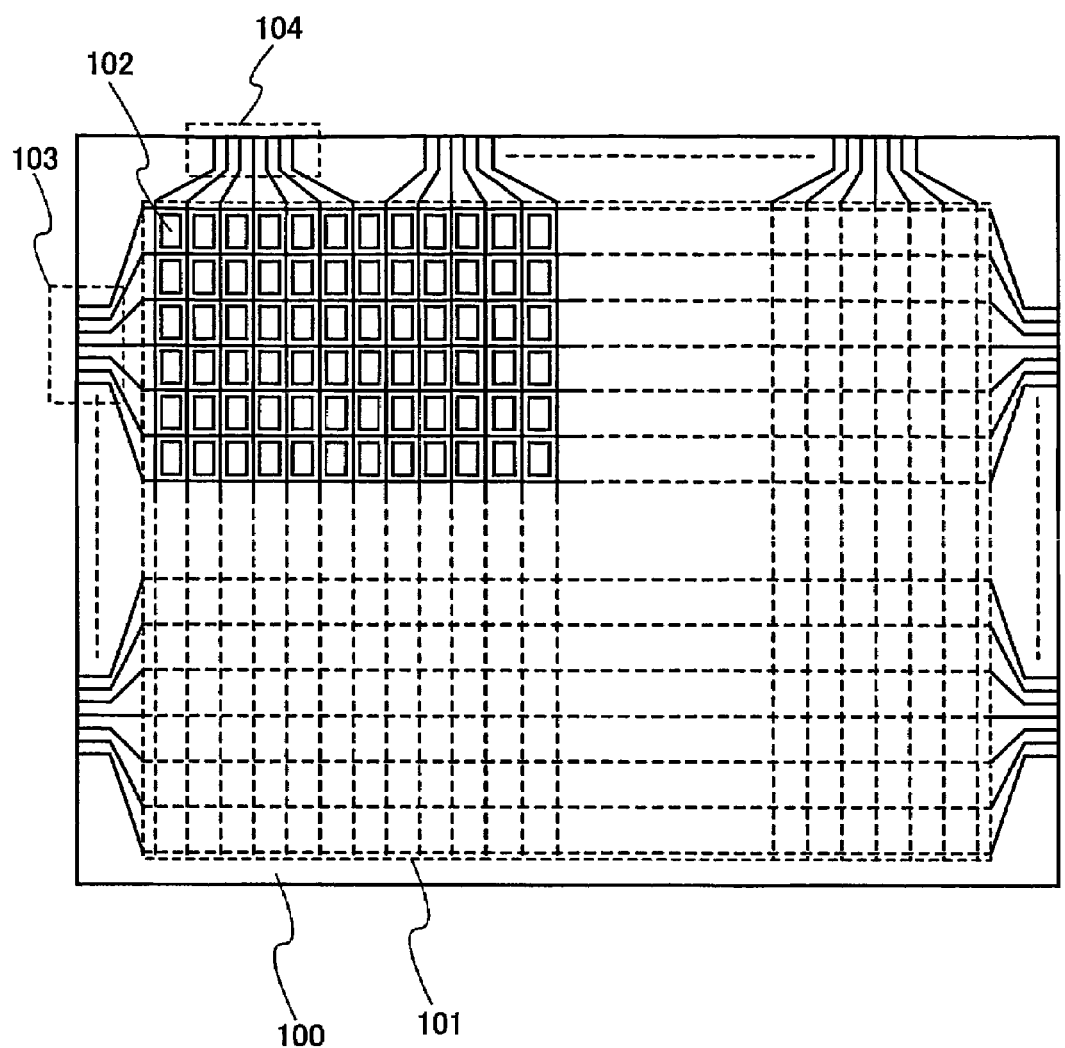
FIG. 1 is a top view showing a structure of a liquid-crystal display panel of the present invention.

Embodiment modes of the present invention are described in detail with reference to the drawings. Note that the same reference numerals denote the same parts among each drawing, and description is not repeated in the following description. The present invention is not limited to the following description. As is easily known to a person skilled in the art, the mode and the detail of the invention can be variously changed without departing from the purpose and the scope of the present invention.

FIG. 1 is a top view showing a structure of a liquid crystal display panel according to the present invention. A pixel portion 101 in which pixels 102 are arranged in a matrix, a scanning line side input terminal 103, and a signal line side input terminal 104 are formed over a substrate 100 having an insulating surface. The number of pixels may be determined in accordance with various standards. The number of pixels of XGA may be 1024×768×3 (RGB), that of UXGA may be 1600×1200×3 (RGB), and that of a full-spec High-Vision may be 1920×1080×3 (RGB).

The pixels 102 are arranged in a matrix by intersecting a scanning line extended from the scanning line side input terminal 103 with a signal line extended from the signal line side input terminal 104. Each pixel 102 is provided with a switching element and a pixel electrode connected thereto. A typical example of the switching element is a TFT. A gate electrode side of a TFT is connected to the scanning line, and a source or drain side thereof is connected to the signal line; accordingly, each pixel can be controlled independently by a signal inputted from outside.

A TFT includes a semiconductor layer, a gate insulating layer, and a gate electrode layer as its main components. A wiring layer connected to a source-drain region formed in the semiconductor layer is also included. A top gate type in which a semiconductor layer, a gate insulating layer, and a gate electrode layer are arranged from the substrate side, a bottom gate type in which a gate electrode layer, a gate insulating layer, and a semiconductor layer are arranged from the substrate side, and the like are known as a typical structure of a TFT. However, any one of the structures may be employed in the present invention.

An amorphous semiconductor (hereinafter also refereed to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semi-amorphous (also referred to as microcrystal) semiconductor (hereinafter also referred to as an "SAS"); or the like can be used as a material for forming the semiconductor layer.

The SAS means a semiconductor having an intermediate structure of an amorphous structure and a crystalline structure (including a single crystal and a poly-crystal) and having a third state which is stable in terms of free energy, and includes a crystalline semiconductor region having short-distance order and lattice distortion. A crystalline region of from 0.5 nm to 20 nm can be observed at least in a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. Hydrogen or halogen of at least 1 atomic % or more is contained as a neutralizer of a dangling bond. The SAS is formed by performing glow discharge decomposition (plasma CVD) on a silicide gas. SiH$_4$ is given as a typical silicide gas. In addition, Si$_2$H$_6$, SiH$_2$Cl$_2$, SiHCl$_3$, SiCl$_4$, SiF$_4$, or the like can also be used as the silicide gas. Further, GeF$_4$ may be mixed. This silicide gas may be diluted with H$_2$ or H$_2$ and one or more rare gas elements of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is 1×10$^{20}$ cm$^{-1}$ or less as an impurity element in the film, specifically, an oxygen concentration is 5×10$^{19}$/cm$^3$ or less, preferably 1×10$^{19}$/cm$^3$ or less.

Figure 2:
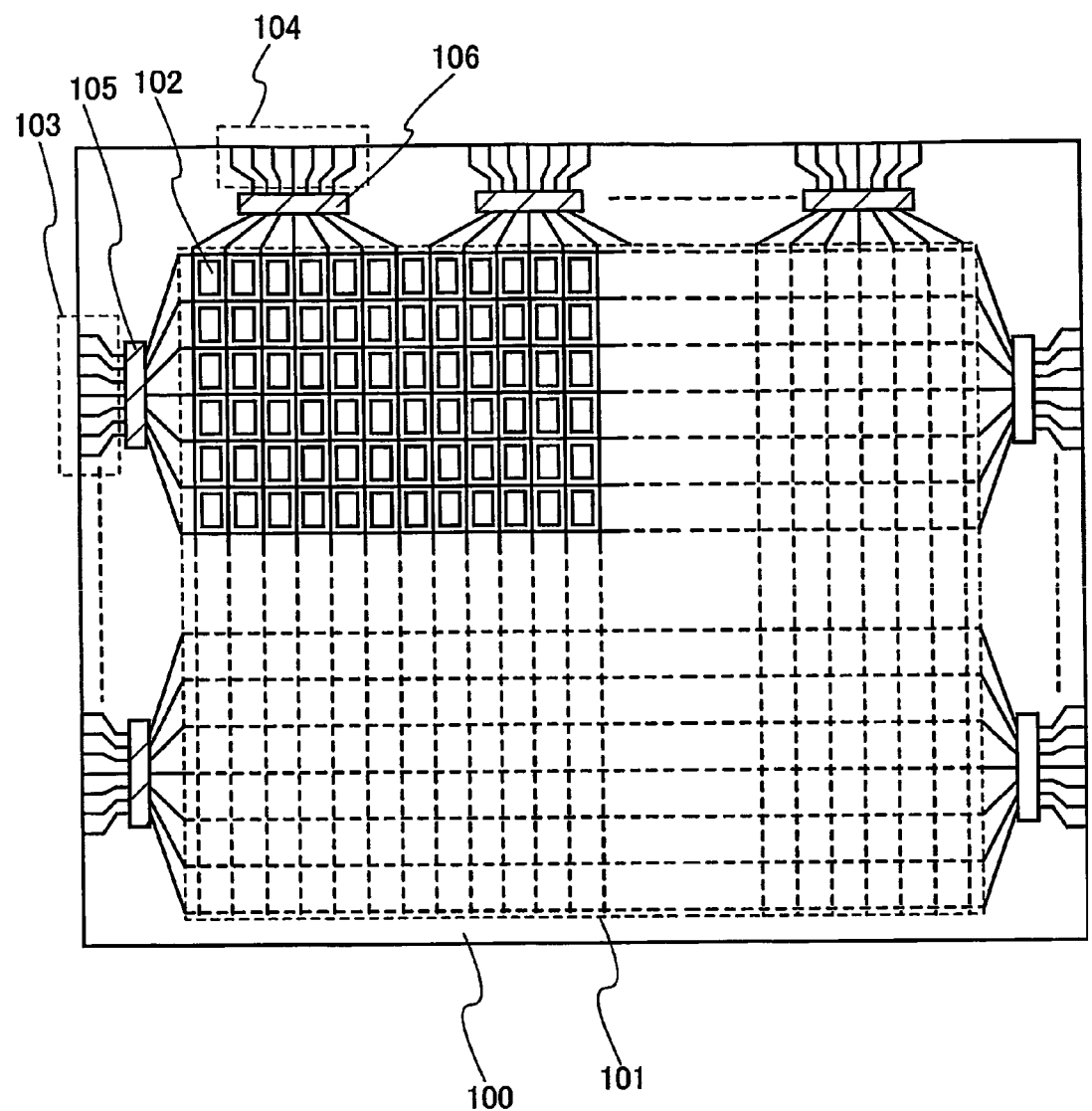
FIG. 2 is a top view showing a structure of a liquid-crystal display panel of the present invention.

FIG. 1 shows a structure of a liquid crystal display panel that controls a signal to be inputted to a scanning line and a signal line by an external driver circuit. Furthermore, driver ICs 105 and 106 may be mounted on a substrate 100 by COG (Chip on Glass) as shown in FIG. 2. The driver IC may be the one formed over a single crystal semiconductor substrate or a circuit including a TFT formed over a glass substrate.

Figure 3:
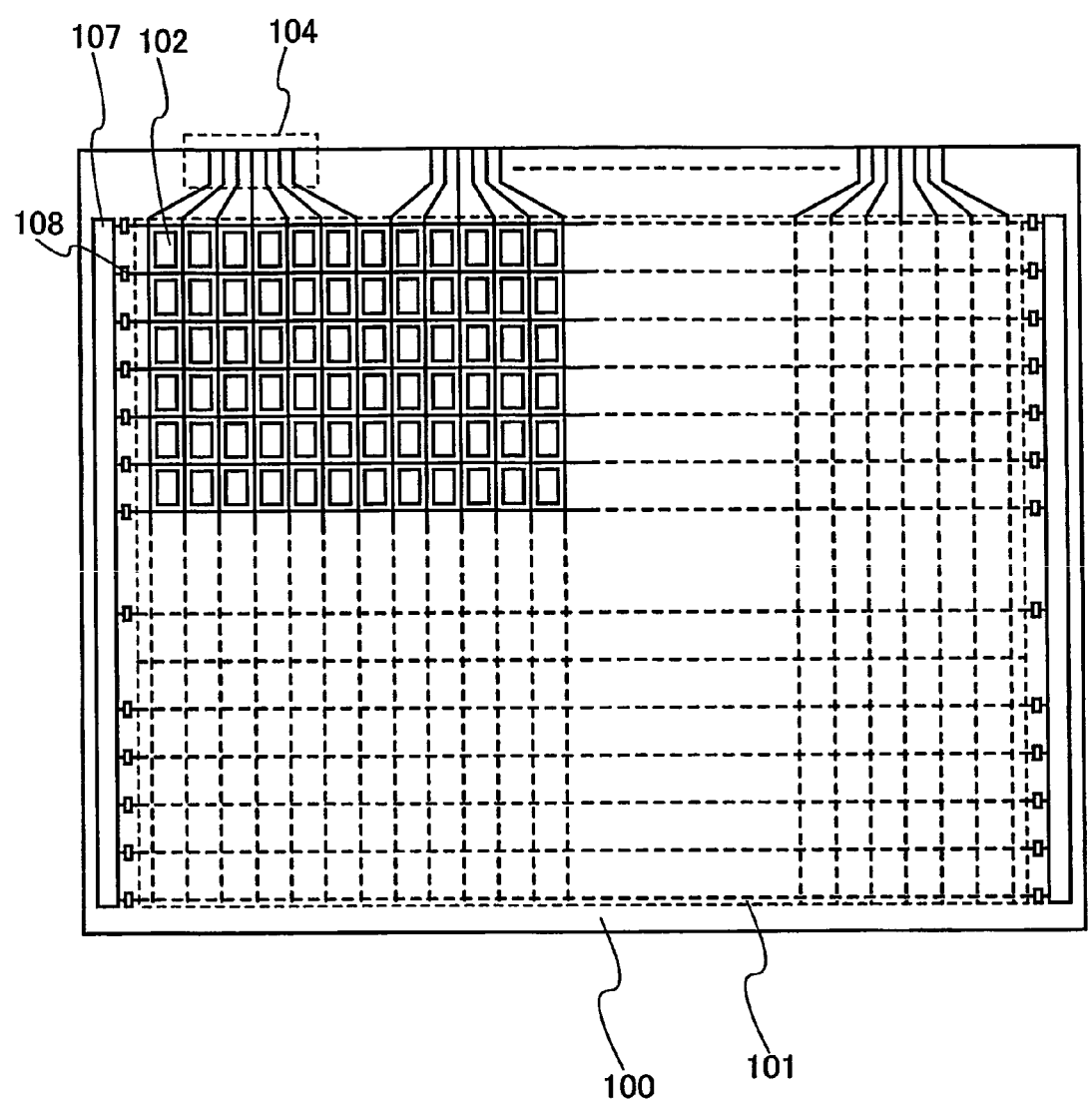
FIG. 3 is a top view showing a structure of a liquid-crystal display panel of the present invention.

When a TFT included in a pixel is formed of an SAS, the scanning line side driver circuit 107 can be integrally formed over the substrate 100 as shown in FIG. 3. Note that a protection diode 108 can also be integrally formed over the substrate 100.

Figure 28:
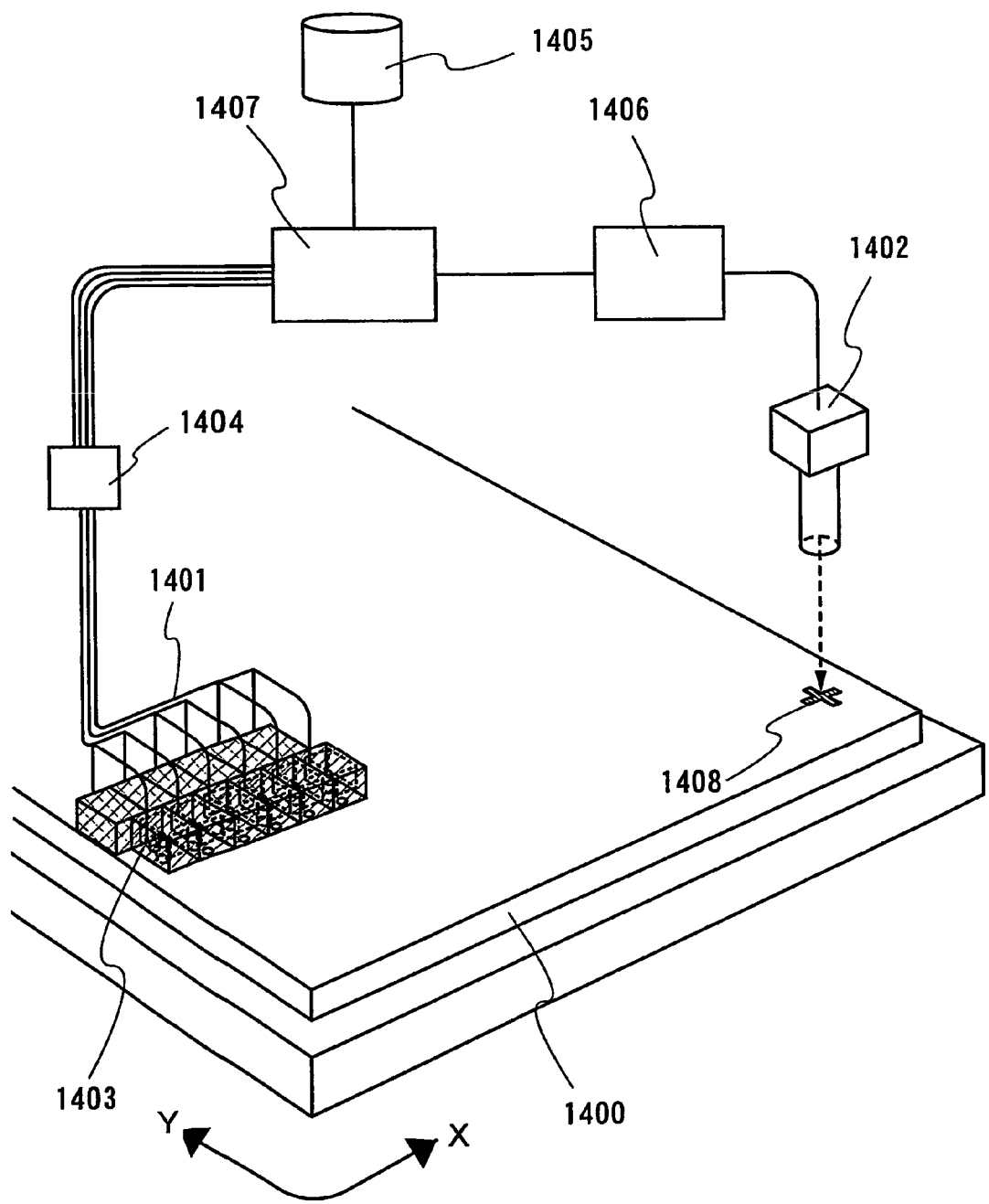
FIG. 28 shows a structure of a droplet discharge apparatus, which can be applied to the present invention.

FIG. 28 shows one mode of a droplet discharge apparatus used for forming a pattern. Each head 1403 of a droplet discharge means 1401 is connected to a control means 1404, and that is controlled by a computer 1407, so that a preprogrammed pattern can be drawn. A timing of drawing may be determined based on, for example, a marker 1408 formed over the substrate 1400. Alternatively, a reference point can be fixed based on an edge of the substrate 1400. That is detected by an imaging means 1402 such as a CCD, and converted into a digital signal by an image processing means 1406. Then, the digital signal is recognized by the computer 1407, and a control signal is generated and is transmitted to the control means 1404. Naturally, information on a pattern to be formed over the substrate 1400 is stored in a storage medium 1405, and the control signal is transmitted to the control means 1404 based on the information, so that each head 1403 of the droplet discharge means 1401 can be independently controlled. Furthermore, an apparatus which can perform drawing by moving a head operable back and forth, around, and also in an oblique direction may be used. A droplet discharge apparatus which can discharge a large number of compositions from one head may also be used.

Subsequently, details of the pixel 102 are described in accordance with a manufacturing step using a droplet discharge method.

Embodiment Mode 1

A method for manufacturing a channel protection type thin film transistor is described in this embodiment mode.

Figure 4A:
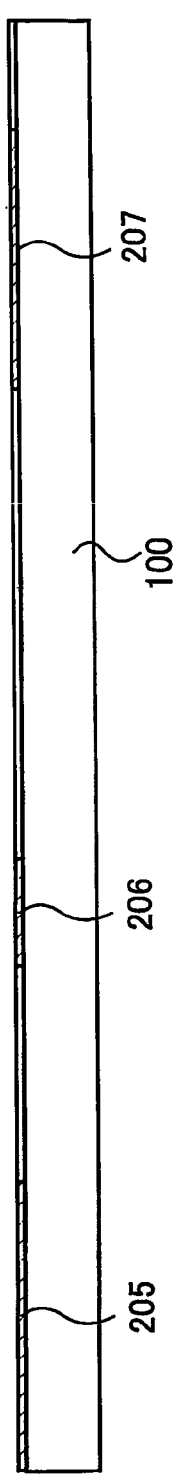
FIGS. 4A to 4C are cross-sectional views showing a method for manufacturing a liquid crystal display device of the present invention.
Figure 4B:
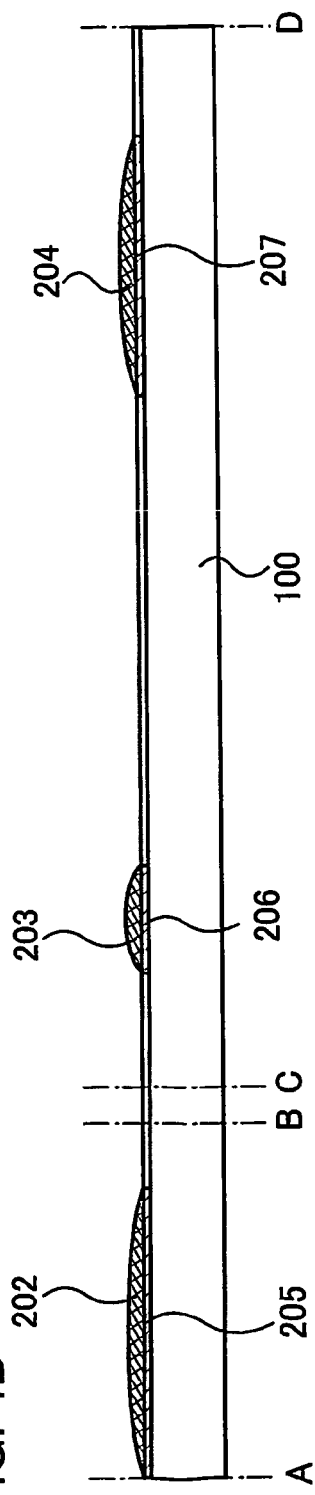
Figure 13:
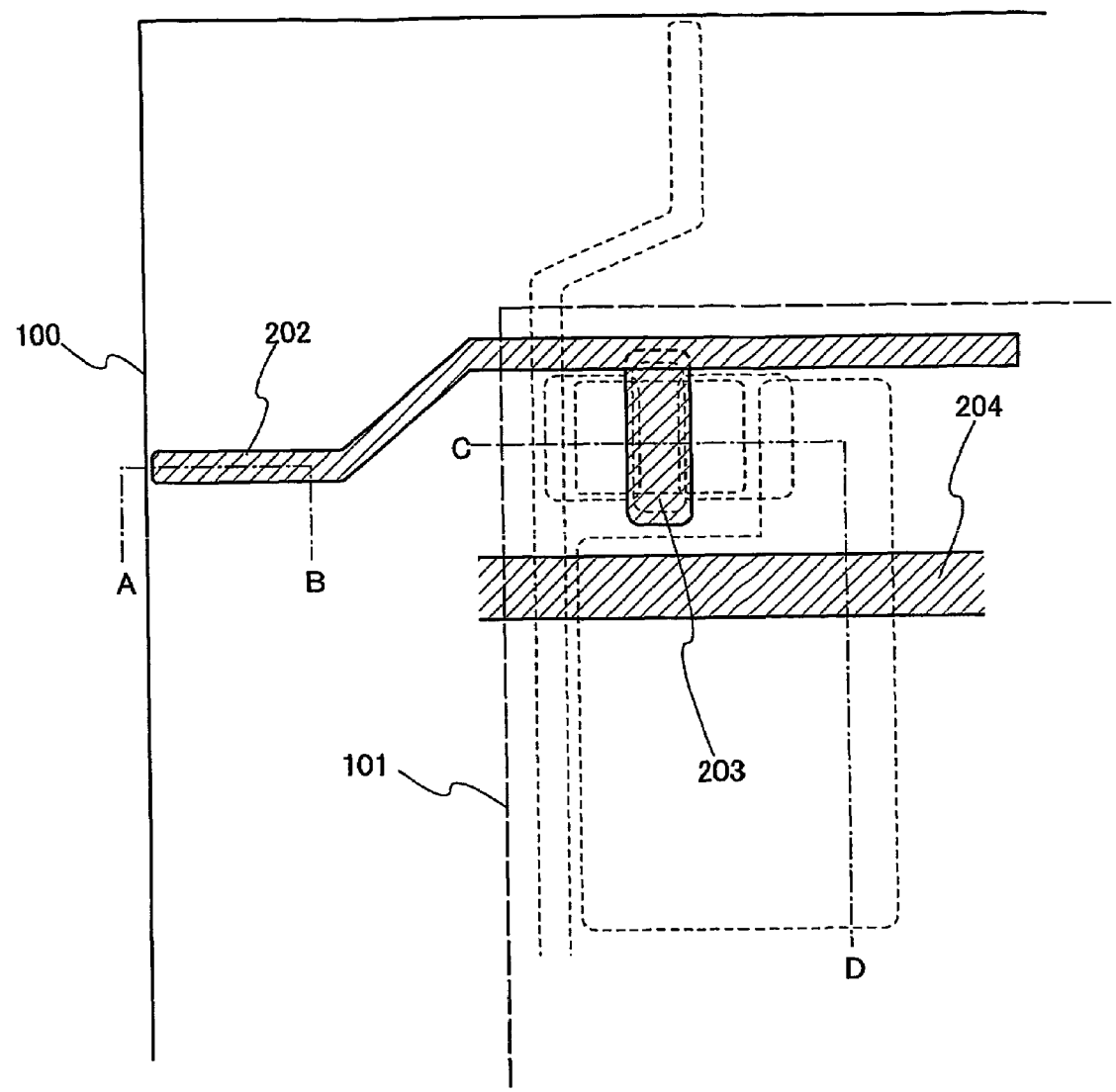
FIG. 13 is a top view showing a method for manufacturing a liquid crystal display device of the present invention.

FIG. 4B shows a step of forming a gate electrode layer and a gate wiring layer which is connected to the gate electrode layer over a substrate 100 by a droplet discharge method. Note that FIG. 4B schematically shows a longitudinal sectional structure, and a planar structure corresponding to a line A-B and a line C-D in FIG. 4B is shown in FIG. 13, which can also be referred to simultaneously.

In addition to a non-alkaline glass substrate manufactured by a fusion method or a floating method such as barium borosilicate glass, alumino borosilicate glass, or aluminosilicate glass and a ceramic substrate, a plastic substrate having enough heat resistance to withstand a processing temperature of this manufacturing step or the like can be used for the substrate 100. In addition, a semiconductor substrate of single crystal silicon or the like, or a metal substrate of stainless steel or the like whose surface is provided with an insulating layer may also be applied. Further, a glass substrate on which chemical mechanical polishing (CMP) treatment is performed may be used.

First, base treatment is performed to improve adhesion when a conductive material such as a gate electrode is formed over the substrate by a droplet discharge method.

As a first method, a conductive layer made of a metal material such as Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (palladium), Pt (platinum), Mo (molybdenum), Co (cobalt), or Rh (rhodium) is preferably formed by a method such as a sputtering method or a vapor deposition method. The conductive layer may be formed to have a film thickness of from 0.01 nm to 10 nm. It may be formed to be extremely thin and need not necessarily have a layer structure. Note that this conductive layer is provided to form the gate electrode layer with good adhesion. When sufficient adhesion is obtained, the gate electrode layer may be directly formed over the substrate 100 without forming the conductive layer. At this time, adhesion is improved particularly when Ag, Cu, a laminate of Ag/Cu, or the like is used for the gate electrode.

As a second method, a photocatalytic substance is formed over a region where a conductive material is to be formed. The photocatalytic substance can be formed by a dip coating method of a sol-gel method, a spin coating method, an ink-jet method, an ion plating method, an ion beam method, a CVD method, a sputtering method, an RF magnetron sputtering method, a plasma spray method, or an anodic oxidation method. A photocatalytic substance made of an oxide semiconductor including a plurality of metals can be formed by mixing and melting a salt of a constituent element. A solvent may be baked or dried when it is necessary to be removed in the case of forming the photocatalytic substance by an application method such as a dip coating method or a spin coating method. Specifically, it may be heated at a predetermined temperature (for example, 300° C. or more), preferably, in an atmosphere including oxygen. For example, baling is performed using Ag as a conductive paste in an atmosphere including oxygen and nitrogen; then, an organic material such as a thermosetting resin is decomposed. Therefore, Ag without containing an organic material can be obtained. Accordingly, planarity on the surface of Ag can be enhanced.

According to the heat treatment, the photocatalytic substance can have a predetermined crystal structure. For example, it has an anatase type or a rutile-anatase mixed type. The anatase type is preferentially formed in a low temperature phase. Therefore, the photocatalytic substance may be heated when it does not have a predetermined crystal structure. In addition, the photocatalytic substance can be formed plural times to obtain a predetermined film thickness in the case of being formed by an application method.

The case of forming $TiO_x$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_x$ having high photocatalytic activity. It is preferable to form $TiO_x$ while heating a film formation chamber or a substrate provided with an object to be treated.

The thus formed $TiO_x$ has a photocatalytic function even when it is a very thin film.

Subsequently, light is converged by using an optical system to form an irradiation region by selectively performing light irradiation. Light is converged by a lens, for example. Then, light irradiation is selectively performed by relatively moving $TiO_x$ and the light. Accordingly, an irradiation region and a non-irradiation region can be formed. $TiO_x$ in the irradiation region shows a hydrophilic property. Note that it can be at once hydrophilic and oleophilic depending on a length of irradiation time.

A lamp (for example, an ultraviolet lamp, so-called black light) or laser light (for example, a XeCl excimer laser having an oscillation wavelength of 308 nm, a XeF excimer laser having an oscillation wavelength of 351 nm, a KrF excimer laser having an oscillation wavelength of 248 nm, or the like) can be used as the light. It is preferable to use laser light which can oscillate a specific wavelength. In addition, the light is only necessary to be light having such a wavelength that photocatalytically activates $TiO_x$, and $TiO_x$ can be selectively irradiated with light by utilizing external light.

In this step, light irradiation is performed in a dark room or in a reaction room where at least a photocatalytically activating wavelength is removed or reduced to selectively perform light irradiation. At least a reaction chamber of an apparatus itself may be a dark room, or at least a photocatalytically activating wavelength may be removed or reduced.

In addition, light irradiation can be entirely performed by selectively forming $TiO_x$ in a region where a conductive material is to be formed. For example, $TiO_x$ is selectively formed by an ink-jet method, a spin coating method with a metal mask having a desired shape arranged, or the like; thereafter, light irradiation may be entirely performed by using a lamp, laser light, or the like. Accordingly, selectively formed $TiO_x$ becomes hydrophilic.

$TiO_x$ can be prevented from unnecessarily reacting when irradiated with light such as external light after forming a thin film transistor or a semiconductor device by selectively forming $TiO_x$ in this way. Namely, a wet etching method or a dry etching method using a conductive film as a mask need not be used to remove $TiO_x$ which is formed except below the conductive film, that is, unnecessary $TiO_x$ for forming a wiring.

In addition, $TiO_x$ in a desired region where the conductive material is to be formed can be made hydrophilic by forming a protective film, selectively removing the protective film, and performing light irradiation after entirely forming $TiO_x$. A dry etching method or a wet etching method can be employed as a method for selectively removing the protective film. Alternatively, the protective film may be removed by laser ablation using laser light having certain power or more and having such a wavelength that photocatalytically activates $TiO_x$. In this case, selective removal of the protective film and photocatalytic activation of $TiO_x$ can be simultaneously performed. Subsequently, a material which absorbs or reflects light having certain power or less and a photocatalytically activating wavelength is selected for the protective film so that $TiO_x$ is not irradiated with light having a photocatalytically activating wavelength. Namely, the protective film is selected in consideration of being irradiated with light having a photocatalytically activating wavelength included in external light. As a result, $TiO_x$ can be prevented from being irradiated with light having a photocatalytically activating wavelength during transfer between reaction chambers or during use as a product. In addition, the material used for the protective film can absorb or reflect light having a photocatalytically activating wavelength by controlling a film thickness. Further, the protective film can be formed by laminating a plurality of materials. Accordingly, it becomes possible to widely absorb or reflect light having a photocatalytically activating wavelength.

In this way, $TiO_x$ can be selectively made hydrophilic. A width of a hydrophilic region may be a desired width of a wiring, and a light irradiation region can be narrowed by the optical system.

Adhesion can be improved particularly when Ag, Cu, or a laminate of Ag/Cu is formed as a conductive material formed by discharging after $TiO_x$, preferably, $TiO_2$ is formed and is made hydrophilic as base treatment on a formation face.

The treatment can be performed before and after formation of the conductive layer without limiting on a base substrate.

As a third method, plasma treatment is performed on a formation face of the gate electrode or the like. For example, plasma treatment is performed on a base film when the formation face of the gate electrode is a base film. Non-contact plasma treatment may be performed on the formation face of the gate electrode.

The plasma treatment is performed using air, oxygen, or nitrogen as a treatment gas under the pressure of from several tens of Torr to 800 Torr (106400 Pa), preferably, from 700 Torr (93100 Pa) to 800 Torr (atmospheric pressure or pressure in proximity of atmospheric pressure). In addition, an RF source or an AC source can be used as a power source of the plasma treatment. For example, plasma is generated by varying power with voltage applied using an AC source under conditions of alternate voltage of 100 V, a frequency of 13.56 MHz, and the like. Pulse is applied with an interval of voltage width of from 2 μsec to 4 μsec to discharge stable plasma. As a result of performing this plasma treatment, surface modification is performed to be liquid-repellent, that is, low in wettability to liquid such as alcohol or oil.

In this embodiment mode, after a $TiO_2$ layer is entirely formed over the substrate, a protective film (not shown) is formed and is selectively removed, and then, is irradiated with light, so that a $TiO_2$ layer in a desired region where a conductive material is to be formed is made hydrophilic. A region where the $TiO_2$ layer is hydrophilic is indicated by $TiO_2$ layers 205, 206, and 207 (FIG. 4A).

A gate wiring layer 202, a gate electrode layer 203, and a capacitor wiring layer 204 are formed by discharging a composition including a conductive material to the $TiO_2$ layers 205, 206, and 207 with a droplet discharge method (FIG. 4B). A composition containing a particle of a metal such as Ag (silver), Au (gold), Cu (copper), W (tungsten), or Al (aluminum) as the main component can be used as the conductive material for forming these layers. In addition, light-transmitting indium tin oxide (ITO) or indium tin oxide containing silicon oxide (ITSO) may be combined. Specifically, the gate wiring layer is preferably made low resistant. Therefore, it is preferable to use any material selected from gold, silver, and copper, which is dissolved or dispersed in a solvent, taking a specific resistance value into consideration. It is more preferable to use silver or copper having a low resistance value. However, in the case of using silver or copper, a barrier film may be additionally provided as a measure against an impurity. The solvent corresponds to esters such as butyl acetate, alcohols such as isopropyl alcohol, an organic solvent such as acetone, or the like. Surface tension and viscosity are appropriately adjusted by adjusting concentration of the solvent and adding a surfactant or the like. Thereafter, when the solvent of a discharged dot is required to remove, heat treatment for baking or drying is performed. Specifically, heat treatment is performed preferably in an atmosphere including oxygen at a predetermined temperature, for example, from 200° C. to 300° C. At this time, heating temperature is set so as not to produce unevenness on a surface of the gate electrode. In the case of using a dot including silver (Ag) as in this embodiment mode, silver (Ag) not including an organic material can be obtained since an organic material such as a thermosetting resin of an adhesive or the like included in a solvent is decomposed when heat treatment is performed in an atmosphere including oxygen and nitrogen. Consequently, planarity of a gate electrode surface can be enhanced and a specific resistance value can be lowered.

A diameter of a nozzle used in a droplet discharge method is set to be from 0.02 μm to 100 μm (preferably, 30 μm or less), and the amount of a composition to be discharged from the nozzle is preferably set to be from 0.001 pl to 100 pl (preferably, 10 pl or less). There are two types of an on-demand type and a continuous type for a droplet discharge method, either of which may be used. Furthermore, there are a piezoelectric type using properties of a piezoelectric material that transforms by applying voltage and a heating type that boils a composition by a heater provided in a nozzle and discharges the composition for a nozzle to be used in a droplet discharge method, either of which may be used. A distance between an object to be treated and a discharge opening of the nozzle is preferably made as short as possible to drop a droplet on a desired position, which is preferably set to be from 0.1 mm to 3 mm (preferably, 1 mm or less). While keeping the relative distance between the nozzle and the object to be treated, either the nozzle or the object to be treated moves and a desired pattern is drawn. In addition, plasma treatment may be performed on a surface of the object to be treated before discharging a composition. This is to take advantage of a surface of the object to be treated becoming hydrophilic or lyophobic when plasma treatment is performed. For example, it becomes hydrophilic to purified water and it becomes lyophobic to a paste dissolved in alcohol.

A step of discharging a composition may be performed under low pressure, so that a solvent of the composition can be volatilized while the composition is discharged and lands on the object to be treated and later steps of drying and baking can be omitted or shortened. After discharging a composition, either or both steps of drying and baking is/are performed by laser light irradiation, rapid thermal annealing, a heating furnace, or the like under atmospheric pressure or low pressure. The both steps of drying and baking are steps of heat treatment. For example, drying is performed at a temperature of 100° C. for 3 minutes and baking is performed at a temperature of from 200° C. to 350° C. for from 15 minutes to 120 minutes, each of which has different purpose, temperature, and period. In order to favorably perform the steps of drying and baking, the substrate may be heated, of which temperature is set to be from 100° C. to 800° C. preferably, from 200° C. to 350° C.), although it depends on a material of the substrate or the like. According to this step, the solvent in the composition is volatilized or a dispersant is removed chemically, and a peripheral resin cures and shrinks, thereby accelerating fusion and welding. It is performed in the oxygen atmosphere, the nitrogen atmosphere, or the atmosphere air. However, this step is preferably performed in the oxygen atmosphere in which a solvent decomposing or dispersing a metal element is easily removed.

A continuous wave or pulsed wave gas laser or solid laser may be used for laser light irradiation. An excimer laser, a YAG laser, or the like can be given as a gas laser, and a laser using a crystal of YAG, $YVO_4$, or the like which is doped with Cr, Nd, or the like can be given as a solid laser. Note that it is preferable to use a continuous wave laser in relation to absorptance of laser light. Moreover, a so-called hybrid laser irradiation method which combines a pulsed wave and a continuous wave may be used. However, the heat treatment by laser light irradiation may be instantaneously performed within several microseconds to several tens of seconds, depending on heat resistance of the substrate. Rapid thermal annealing (RTA) is performed by raising the temperature rapidly and heating for several microseconds to several minutes using an infrared lamp or a halogen lamp which emits light of from ultraviolet to infrared in an inert gas atmosphere. Since the treatment is performed instantaneously, it has an advantage that only a thin film on a top surface can be substantially heated and a lower layer film is not affected.

Figure 4C:
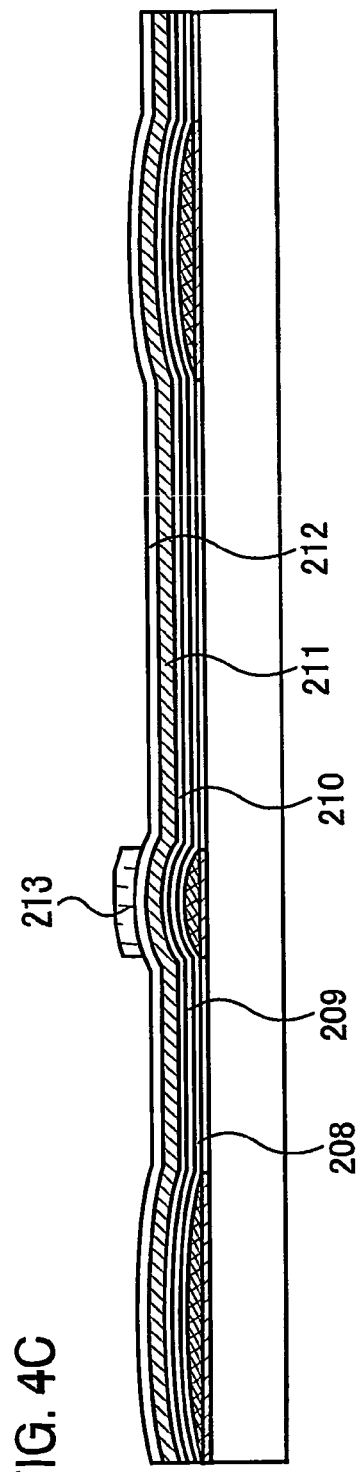

Next, a gate insulating layer is formed to be a single layer or to have a laminated structure by using a plasma CVD method or a sputtering method (ref. FIG. 4C). As a specifically preferable mode, the gate insulating layer corresponds to a lamination body of three layers of an insulating layer 208 made of silicon nitride, an insulating layer 209 made of silicon oxide, and an insulating layer 210 made of silicon nitride. Note that a rare gas element such as argon may be contained in a reactive gas and mixed into an insulating film to be formed in order to form a dense insulating film with little gate leakage current at a low film formation temperature. Deterioration due to oxidation can be prevented when a first layer in contact with the gate wiring layer 202, the gate electrode layer 203, and the capacitor wiring layer 204 is made of silicon nitride or silicon nitride oxide.

Subsequently, a semiconductor layer 211 is formed. The semiconductor layer 211 is made of an AS or a SAS manufactured by a vapor phase growth method or a sputtering method using a semiconductor material gas typified by silane or germane.

In the case of using a plasma CVD method, an AS is formed by using $SiH_4$ which is a semiconductor material gas or a mixed gas of $SiH_4$ and $H_2$. A SAS having a Si composition ratio of 80% or more can be obtained in the case of using a mixed gas in which $SiH_4$ is diluted with $H_2$ by from 3 times to 1000 times or a mixed gas in which $Si_2H_6$ is diluted with $GeF_4$ at a $Si_2H_6$-to-$GeF_4$ gas flow rate of from 20 to 40:0.9. Specifically, the latter case is preferable since the semiconductor layer 211 can have crystallinity from an interface with the base.

An insulating layer 212 is formed on the semiconductor layer 211 by a plasma CVD method or a sputtering method. As shown in the following steps, this insulating layer 212 is left on the semiconductor layer 211 to be opposed to the gate electrode layer and serves as a channel protection layer. Therefore, it is preferable that the insulating layer 212 is made of a dense film to secure cleanliness of the interface and to obtain an advantageous effect of preventing the semiconductor layer 211 from being contaminated with impurities such as an organic substance, a metallic substance, and water vapor. In a glow discharge decomposition method, a silicon nitride film which is formed by diluting a silicide gas with a rare gas such as argon by from 100 times to 500 times is preferable since a dense film can be formed even at a film formation temperature of 100° C. or less. Furthermore, insulating films may be laminated, if necessary.

As for the above steps, it is possible to continuously form the insulating layer 208 to the insulating layer 212 without exposing to the atmosphere. In other words, each interface between laminated layers can be formed without being contaminated by an atmospheric constituent and an airborne contaminating impurity element; therefore, variation in characteristics of the TFT can be reduced.

Subsequently, a mask 213 is formed by selectively discharging a composition to a position opposed to the gate electrode 203, which is on the insulating layer 212 (ref. FIG. 4C). A resin material such as an epoxy resin, an acrylic resin, a phenol resin, a novolac resin, a melamine resin, or a urethane resin is used for the mask 213. In addition, the mask 213 is formed by a droplet discharge method using an organic material such as benzocyclobutene, parylene, flare, or light-transmitting polyimide; a compound material formed by polymerization of a siloxane-based polymer or the like; a composition material containing water-soluble a homopolymer and a water-soluble copolymer, or the like. Alternatively, a commercial resist material including a photosensitive agent may be used. For example, a typical positive type resist in which a novolac resin and naphthoquinonedi azide compound as a photosensitive agent are dissolved and dispersed in a known solvent, a negative type resist in which a base resin, diphenylsilane diol, and an acid generating agent, or the like are dissolved and dispersed in a known solvent may be used. In using any one of the materials, surface tension and viscosity are appropriately adjusted by adjusting concentration of a solvent or adding a surfactant or the like.

Figure 14:
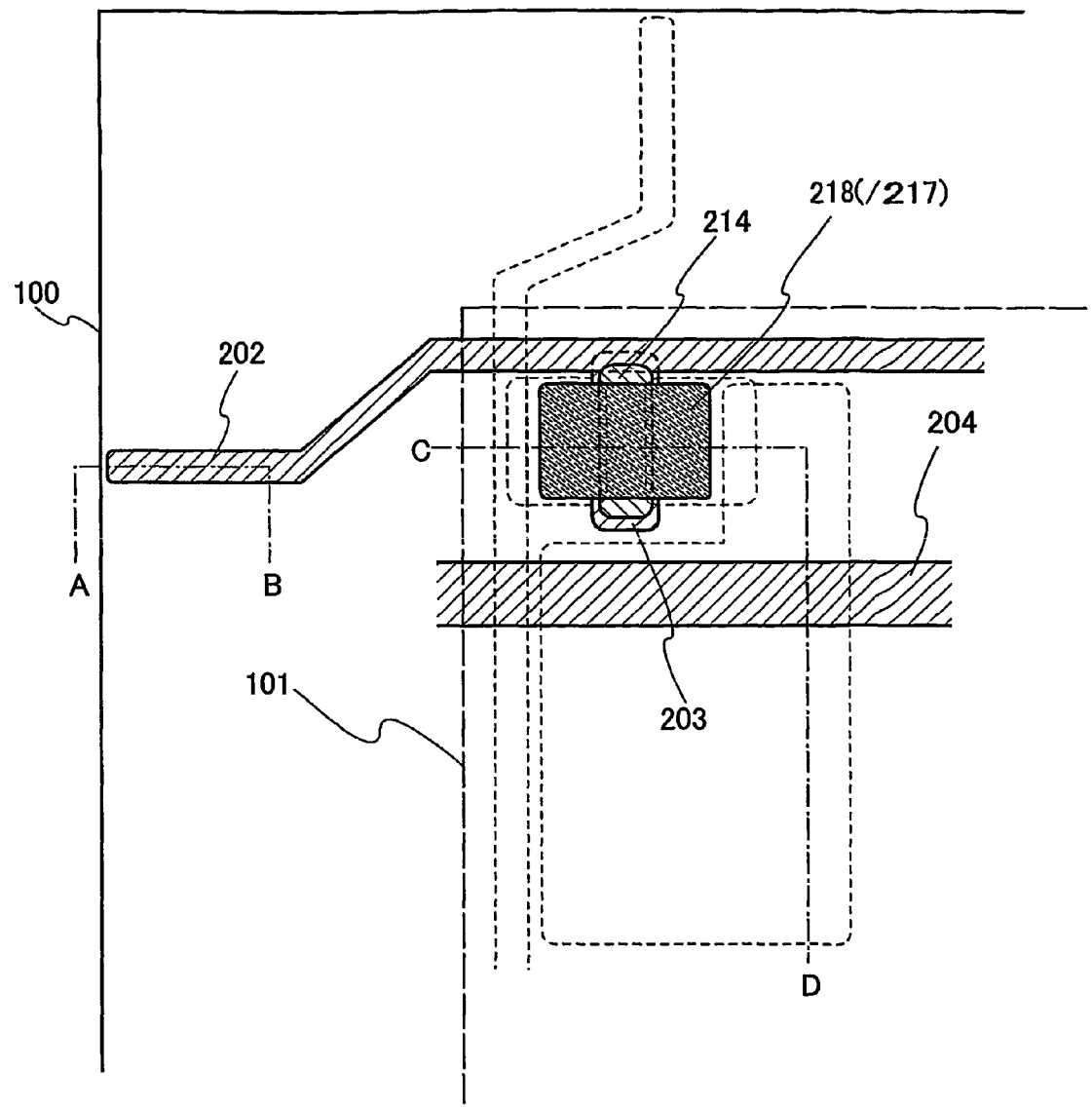
FIG. 14 is a top view showing a method for manufacturing a liquid crystal display device of the present invention.

The insulating layer 212 is etched by utilizing the mask 213, and an insulating layer 214 functioning as a channel protection layer is formed. The mask 213 is removed and an n-type semiconductor layer is formed over the semiconductor layer 211 and the insulating layer 214 (ref. FIGS. 4C and 5A). The n-type semiconductor layer may be formed by using a silane gas and a phosphine gas and can be made of an AS or a SAS. Thereafter, a mask 216 is formed by a droplet discharge method on the n-type semiconductor layer. The n-type semiconductor layer and the semiconductor layer 211 are etched using this mask 216 to form a semiconductor layer 217 and a semiconductor layer having one conductivity type 218 (ref. FIG. 5A). Note that FIG. 5A schematically shows a longitudinal sectional structure, and a planar structure corresponding to A-B and C-D in FIG. 5A is shown in FIG. 14, which can also be referred to simultaneously.

Figure 15:
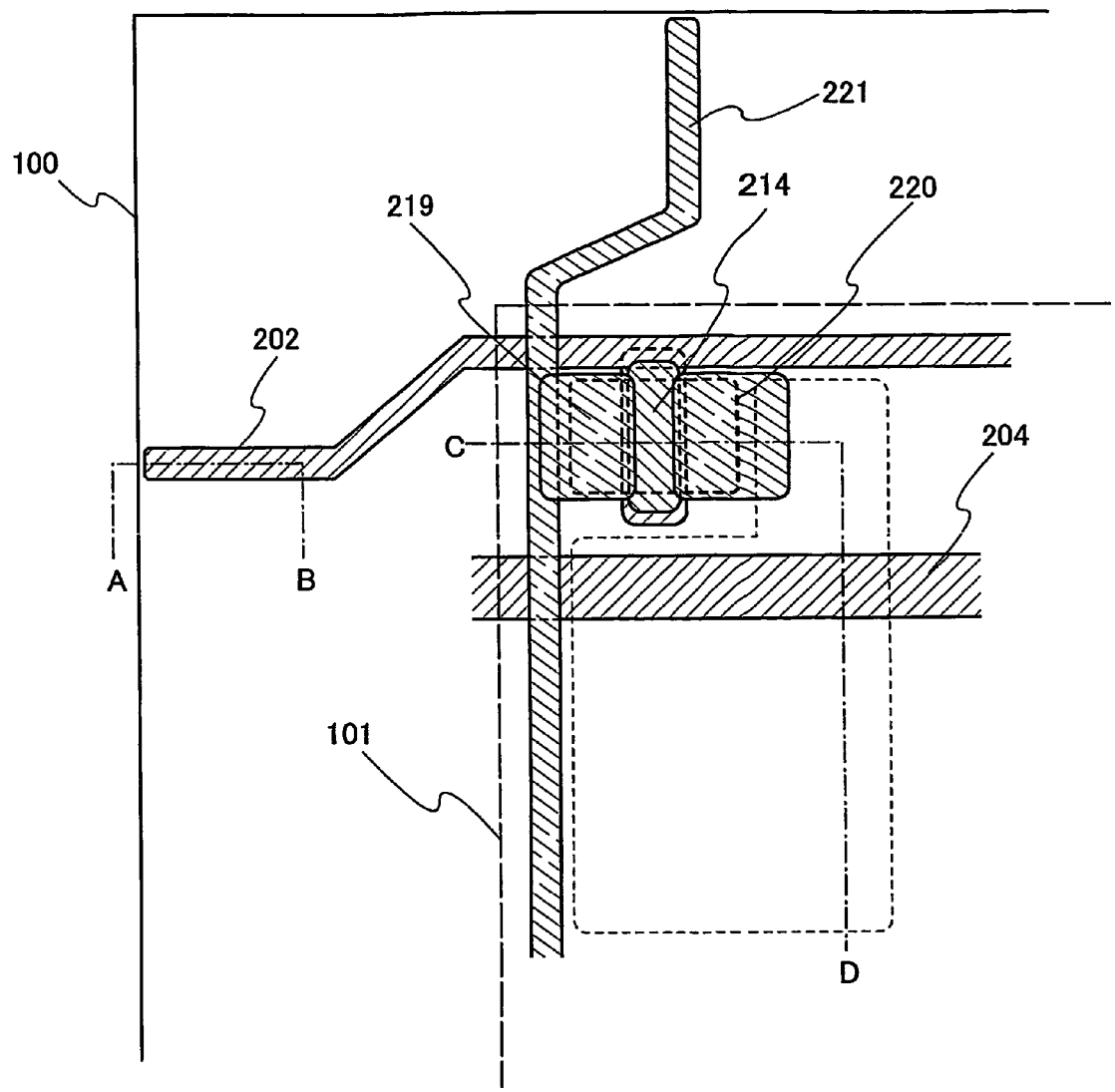
FIG. 15 is a top view showing a method for manufacturing a liquid crystal display device of the present invention.

Subsequently, after removing the mask 216, source-drain wiring layers 219 and 220 are formed with a droplet discharge method by selectively discharging a composition including a conductive material (ref. FIG. 5B). In addition, FIG. 5B schematically shows a longitudinal sectional structure, and a planar structure corresponding to a line A-B and a line C-D in FIG. 5B is shown in FIG. 15. As shown in FIG. 15, a signal wiring 221 extended from one end of the substrate 100 is also formed. The signal wiring 221 is provided to electrically connect to the source-drain wiring layer 219. A composition containing a particle of a metal such as Ag (silver), Au (gold), Cu (copper), W (tungsten), or Al (aluminum) as the main component can be used as the conductive material for forming the wiring layer. In addition, light-transmitting indium tin oxide (ITO), ITSO made of indium tin oxide and silicon oxide, organic indium, organotin, zinc oxide, titanium nitride, or the like may be combined.

Next, n-type semiconductor layers 222 and 223 forming source-drain regions are formed by etching the n-type semiconductor layer 218 on the insulating layer 214, using the source-drain wiring layers 219 and 220 as a mask (ref FIG. 5C).

Figure 6A:
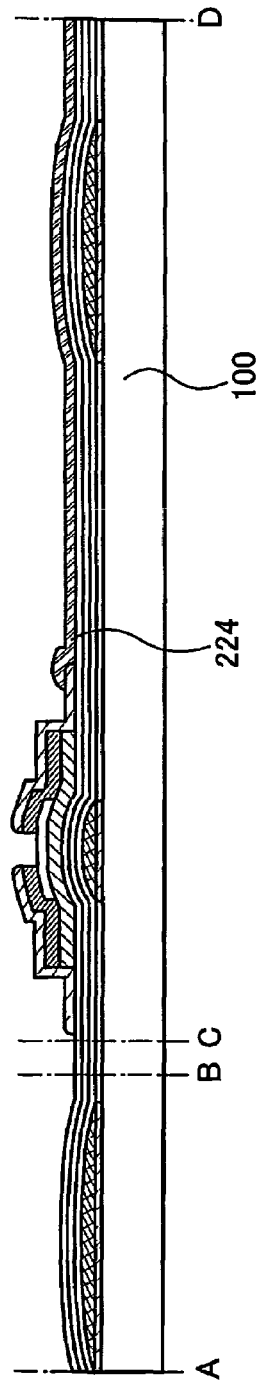
FIGS. 6A to 6C are cross-sectional views showing a method for manufacturing a liquid crystal display device of the present invention.
Figure 16:
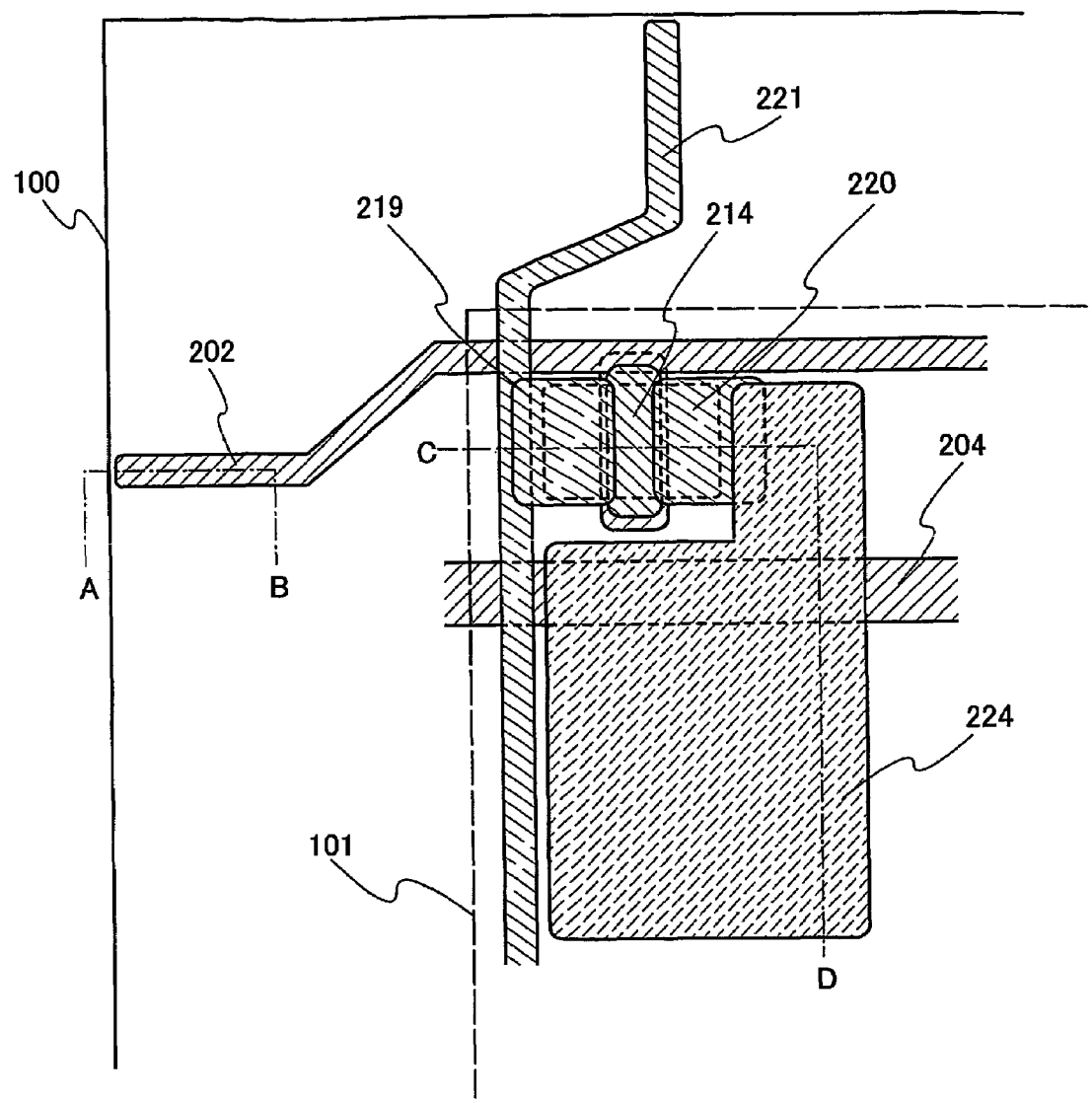
FIG. 16 is a top view showing a method for manufacturing a liquid crystal display device of the present invention.

Subsequently, a pixel electrode layer 224 corresponding to a pixel electrode is formed by selectively discharging a composition including a conductive material to electrically connect to the source-drain wiring layer 220. In the case of manufacturing a transmissive liquid crystal display panel, the pixel electrode layer 224 may be formed by forming a predetermined pattern of a composition containing indium tin oxide (ITO), indium tin oxide containing silicon oxide (ITSO), zinc oxide (ZnO), tin oxide ($SnO_2$), or the like and by baking the pattern. In the case of manufacturing a reflective liquid crystal display panel, a composition including a particle of a metal such as Ag (silver), Au (gold), Cu (copper), W (tungsten), or Al (aluminum) as the main component can be used. As another method, the pixel electrode layer may be formed by forming a transparent conductive film or a light reflective conductive film by a sputtering method, forming a mask pattern by a droplet discharge method, and additionally performing an etching process (ref. FIG. 6A). Note that FIG. 6A schematically shows a longitudinal sectional structure, and a planar structure corresponding to a line A-B and a line C-D in FIG. 6A is shown in FIG. 16, which can also be referred to simultaneously.

According to the above-mentioned steps, a TFT substrate 100 for a liquid crystal display panel in which a bottom gate type (also referred to as an inversed staggered type) TFT and a pixel electrode are connected to each other over the substrate 100 is completed.

Figure 6B:
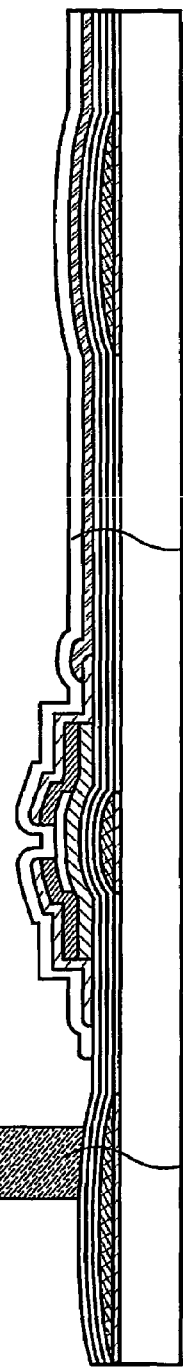

Next, an insulating layer 225 referred to as an alignment film is formed by a printing method or a spin coating method to cover the pixel electrode layer 224. Note that the insulating layer 225 can be selectively formed as shown in the drawing by using a screen printing method or an offset printing method. Thereafter, rubbing is performed. Then, a sealant 226 is formed by a droplet discharge method in the peripheral region where the pixel is formed (ref. FIG. 6B).

Figure 6C:
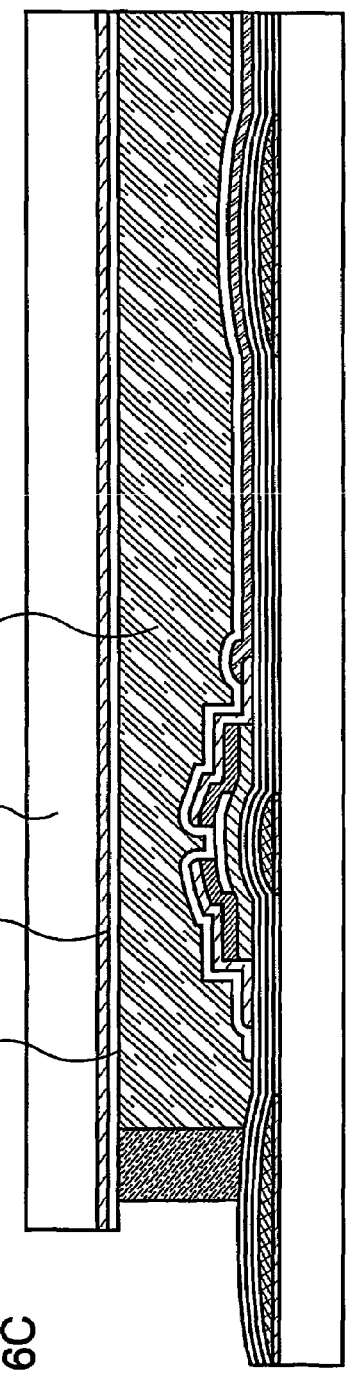

Subsequently, a liquid crystal display panel can be manufactured by attaching an opposite substrate 229 provided with an insulating layer 227 functioning as an alignment film and a conductive layer 228 functioning as an opposite electrode to the TFT substrate 100 with a spacer therebetween, and by providing the space with a liquid crystal layer 230 (ref. FIG. 6C). The sealant 226 may be mixed with a filler, and further, the opposite substrate 229 is provided with a color filter, a shielding film (a black matrix), or the like. Note that a dispenser type (a dropping type) or a dip type (a pumping type) that injects a liquid crystal by using a capillary phenomenon after attaching the opposite substrate 229 can be used as a method for forming the liquid crystal layer.

A closed loop is formed with the sealant 226 in a liquid crystal drip injection method employing a dispenser type, and a liquid crystal is dropped once or plural times therein. Subsequently, the substrates are attached in vacuum, and then, ultraviolet curing is performed to make the space filled with liquid crystals.

Figure 7:
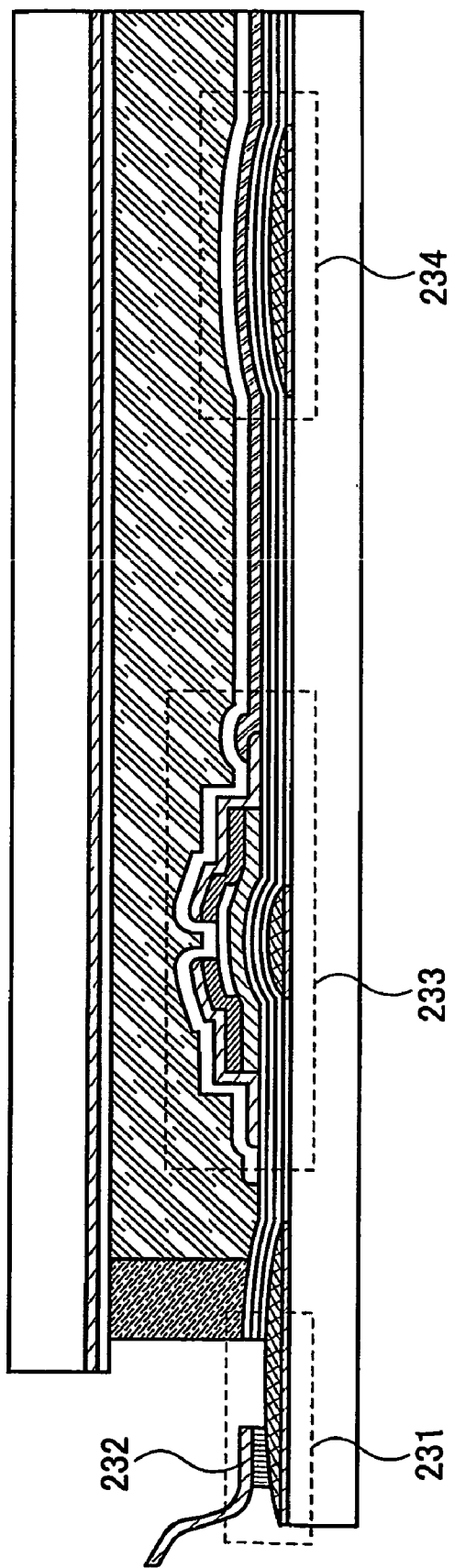
FIG. 7 is a cross-sectional view showing a method for manufacturing a liquid crystal display device of the present invention.

Next, the insulating layers 208 to 210 in a region 231 shown in FIG. 7 are removed by ashing treatment using an oxygen gas under the atmospheric pressure or pressure in proximity of the atmospheric pressure (ref. FIG. 7). This treatment is performed by using an oxygen gas and one or more gases of hydrogen, $CF_4$, $NF_3$, $H_2O$, and $CHF_3$. In this step, ashing treatment is performed after sealing by using the opposite substrate to prevent damage or destruction due to static; however, ashing treatment may be performed at any timing when there are few effects of static.

A connection wiring board 232 is provided to electrically connect to the gate wiring layer 202 with an anisotropic conductive layer therebetween. The wiring board 232 has a function of transmitting a signal and electric potential from external. Through the above steps, a liquid crystal display panel including a channel protection switching TFT 233 and a capacitor element 234. The capacitor element 234 includes the capacitor wiring layer 204, the gate insulating layer, and the pixel electrode layer 224.

As described above, steps can be omitted by not applying a light-exposure step using a photomask in this embodiment mode. In addition, a liquid crystal display panel can be easily manufactured by forming various patterns directly on a substrate by using a droplet discharge method even when a glass substrate of the fifth or the following generation having a side of more than 1000 mm is used.

Embodiment Mode 2

Embodiment Mode 1 shows a structure in which the pixel electrode layer 224 and the source-drain wiring layer 220 are directly in contact with each other; however, an insulating layer may be interposed therebetween as another mode.

Figure 8A:
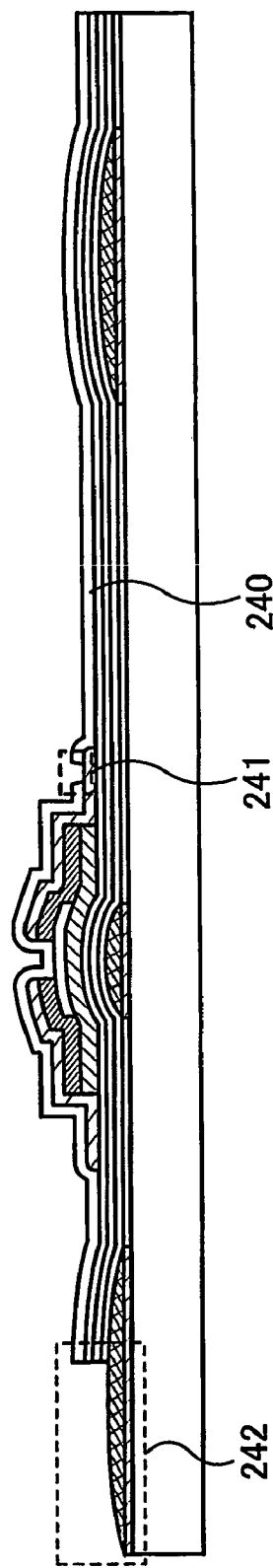
FIGS. 8A and 8B are cross-sectional views showing a method for manufacturing a liquid crystal display device of the present invention.
Figure 8B:
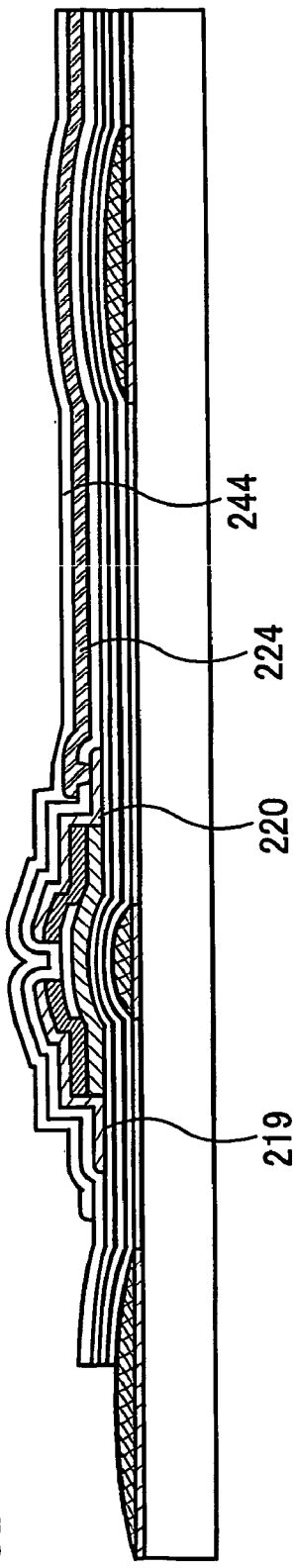

In this case, an insulating layer 240 functioning as a protective film is formed when up to the step show in FIG. 5C is completed (ref. FIG. 8A). A coating of silicon nitride or silicon oxide formed by a sputtering method or a plasma CVD method may be employed as the protective film. It becomes necessary to form an opening 241 in the insulating layer 240, and the source-drain wiring layer 220 is electrically connected to a pixel electrode layer 224 through the opening 241 (ref. FIG. 8B). At the time of forming the opening 241, an opening 242 necessary for attaching a connection terminal later may be simultaneously formed. Reference number 244 denotes an insulating layer.

A method for forming the openings 241 and 242 is not specifically limited; however, an opening can be selectively formed by, for example, plasma etching under the atmospheric pressure. Alternatively, wet etching treatment may be performed after forming a mask by a droplet discharge method. When an inorganic siloxane-based or organic siloxane-based coating is formed by a droplet discharge method as the insulating layer 240, the step of forming an opening can be omitted.

Figure 9:
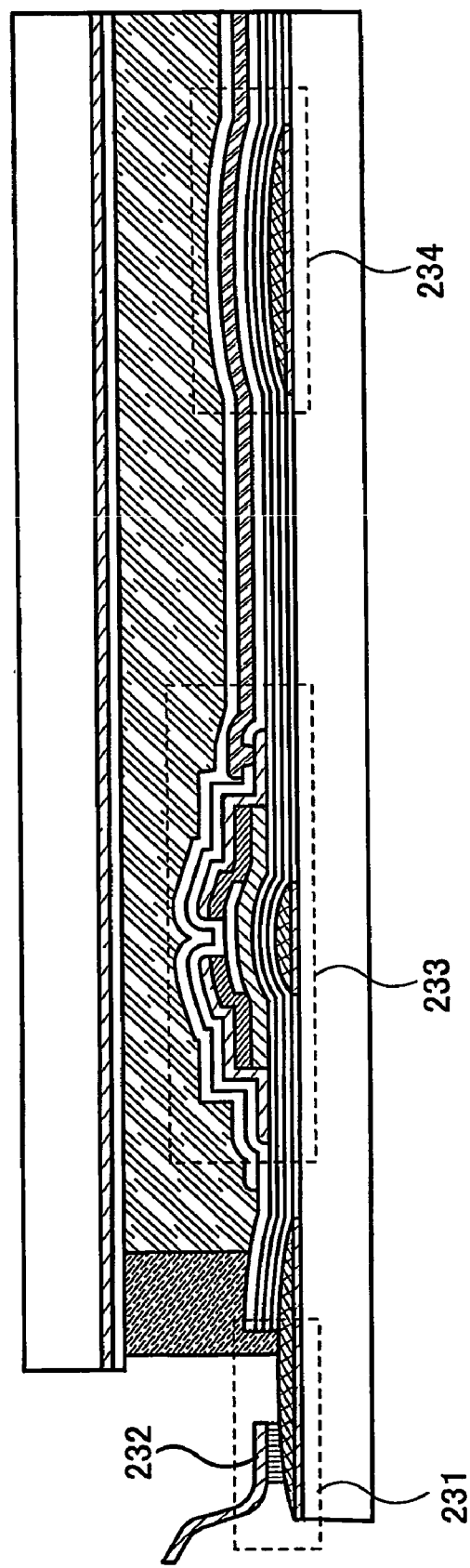
FIG. 9 is a cross-sectional view showing a method for manufacturing a liquid crystal display device of the present invention.

A liquid crystal display panel shown in FIG. 9 is thus completed.

Embodiment Mode 3

A method for manufacturing a channel etch thin film transistor is described in this embodiment mode.

A gate wiring layer 202, a gate electrode layer 203, and a capacitor wiring layer 204 are formed over a substrate 100 by discharging a composition including a conductive material with a droplet discharge method. Subsequently, a gate insulating layer is formed to be a single layer or to have a laminated structure by a plasma CVD method or a sputtering method. A specifically preferable mode of the gate insulating layer corresponds to a lamination body of three layers of an insulating layer 208 made of silicon nitride, an insulating layer 209 made of silicon oxide, and an insulating layer 210 made of silicon nitride. Furthermore, up to a semiconductor layer 211 functioning as an active layer is formed. The above-mentioned steps are similar to those in Embodiment Mode 1.

An n-type semiconductor layer 301 is formed on the semiconductor layer 211 (ref. FIG. 10A). Next, a mask 302 is formed by selectively discharging a composition on the n-type semiconductor layer 301. Subsequently, the semiconductor layer 211 and the n-type semiconductor layer 301 are simultaneously etched by using the mask 302 to form a semiconductor layer 303 and an n-type semiconductor layer 304. Thereafter, source-drain wiring layers 305 and 306 are formed over the n-type semiconductor layer 304 by discharging a composition including a conductive material (ref. FIG. 10B).

Next, the n-type semiconductor layer 304 is etched by using the source-drain wiring layers 305 and 306 as a mask to form n-type semiconductor layers 307 and 308. At this time, the semiconductor layer 303 is also slightly etched to form a semiconductor layer 309. Subsequently, a pixel electrode layer 310 is formed by discharging a composition including a conductive material to electrically connect to the source-drain wiring layer 306 (ref. FIG. 10C).

Figure 11:
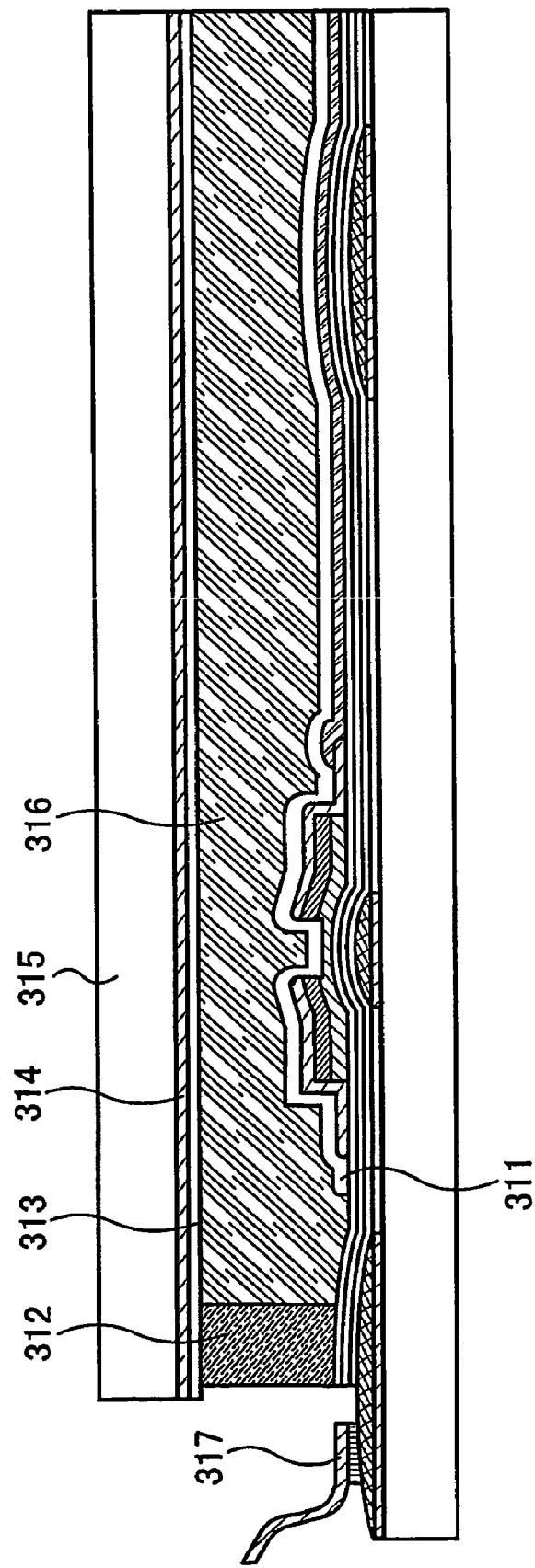
FIG. 11 is a cross-sectional view showing a method for manufacturing a liquid crystal display device of the present invention.

Subsequently, an insulating layer 311 functioning as an alignment film is formed. Then, a sealant 312 is formed, and the substrate 100 and a substrate 315 provided with an opposite electrode 314 and an alignment film 313 are attached by using the sealant 312. Subsequently, a liquid crystal layer 316 is formed between the substrate 100 and the substrate 315. Thereafter, a region to which a connection terminal 317 is to be attached is exposed by etching under the atmospheric pressure or pressure in proximity of the atmospheric pressure, and the connection terminal 317 is attached. Accordingly, a liquid crystal display panel having a display function can be manufactured (ref. FIG. 11).

Embodiment Mode 4

A method for manufacturing a liquid crystal display device including a channel protection thin film transistor having a structure in which a drain wiring overlaps a pixel electrode differently from Embodiment Modes 1 and 2 is described in this embodiment mode with reference to FIGS. 29A to 29D and FIGS. 30A to 30D.

A composition including a conductive material is discharged by a droplet discharge method to a substrate 100 on which base treatment is performed as described in Embodiment Mode 1 to form a gate electrode layer 203 and a capacitor wiring layer 204. As for the base treatment on the substrate 100 here, $TiO_2$ is formed by baking in an oven a Ti film 1100 formed by a sputtering method or a CVD method. Then, a region where a conductive material is to be discharged by a droplet discharge method is selectively irradiated with light to form an activation region 1101.

Subsequently, a gate insulating layer is formed to be a single layer or to have a laminated structure by a plasma CVD method or a sputtering method. Here, a lamination body of two layers of an insulating layer 208 made of silicon nitride and an insulating layer 209 made of silicon oxide corresponds to the gate insulating layer. A lamination body of three layers may be used by combining silicon nitride and silicon oxide as in Embodiment Mode 1. Thereafter, a pixel electrode 9001 is formed by discharging a composition including a conductive material (FIG. 29A). The pixel electrode 9001 may be formed by forming a predetermined pattern of a composition including indium tin oxide (ITO), indium tin oxide containing silicon oxide (ITSO), zinc oxide (ZnO), tin oxide ($SnO_2$), or the like with a droplet discharge method and by baking the pattern.

In addition, the pixel electrode is preferably made of indium tin oxide (ITO), indium tin oxide containing silicon oxide (ITSO), zinc oxide (ZnO) by a sputtering method. More preferably, it may be made of indium tin oxide containing silicon oxide by a sputtering method using a target in which silicon oxide of from 2% to 10% by weight is contained in ITO.

Subsequently, a semiconductor layer 9002 functioning as an active layer is formed (FIG. 29B). A polycrystalline semiconductor formed by crystallizing an amorphous semiconductor, or a SAS, or the like can be used for the semiconductor layer. Thereafter, an insulating layer 214 to be a channel protection layer is formed on the semiconductor layer 9002 by a method described in Embodiment Mode 1 to almost entirely overlap the gate electrode layer 203 (FIG. 29C). An n-type semiconductor layer 9003 is formed by a CVD method using a silane gas and a phosphine gas (FIG. 29D), and then, a mask 216 for patterning the semiconductor layer is formed by a droplet discharge method (FIG. 30A).

The n-type semiconductor layer 9003 and the semiconductor layer 9002 are etched and patterned using the mask 216. Accordingly, they are separated from the pixel electrode 9001 (FIG. 30B). Then, a composition including a conductive material is selectively discharged by a droplet discharge method to form source-drain wiring layers 9004 and 9005, thereby electrically connecting the n-type semiconductor layer 9003 with the pixel electrode 9001 (FIG. 30C). At this time, in order to improve adhesion of the source-drain wiring, a composition including a conductive material is discharged after base treatment is performed on the n-type semiconductor layer 9003 as in the case of base treatment on the substrate. Thus, a source-drain wiring having good adhesion can be formed. A composition including Ag or Cu can be used as the composition including a conductive material, and a wiring of a single layer thereof or a laminated layer of Ag/Cu may be formed.

Figure 37:
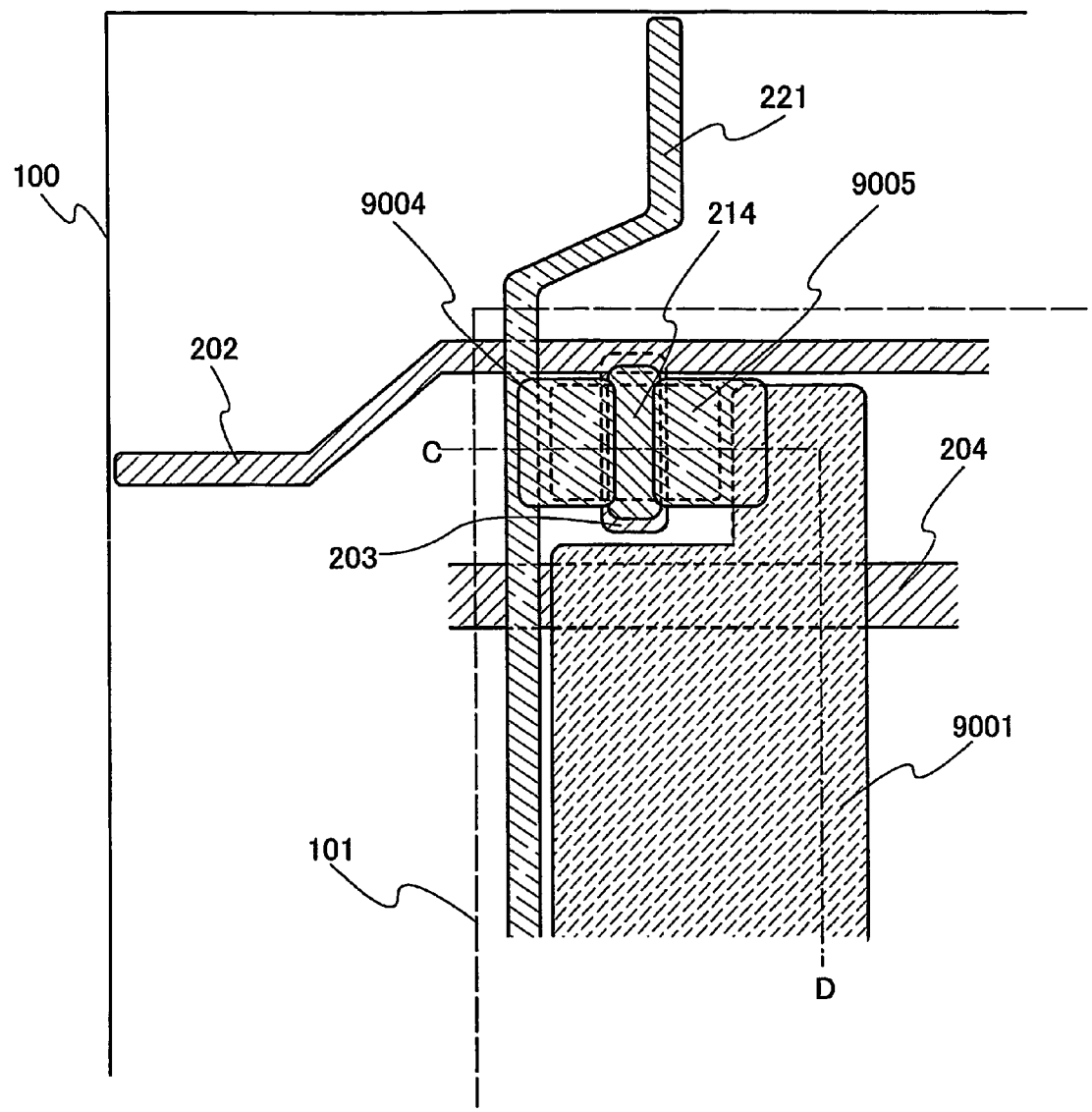
FIG. 37 is a top view showing a method for manufacturing a liquid crystal display device of the present invention.

Subsequently, the n-type semiconductor layer 9003 is etched using the source-drain wiring layers 9004 and 9005 as a mask (FIG. 30D). Through the above-mentioned steps, a TFT substrate for a liquid crystal panel can be formed. FIG. 37 is a top view of the TFT substrate for a liquid crystal panel. FIG. 30D is a cross-sectional view of the TFT substrate for the liquid crystal display panel, taken along a dotted line C-D in FIG. 37.

Figure 31:
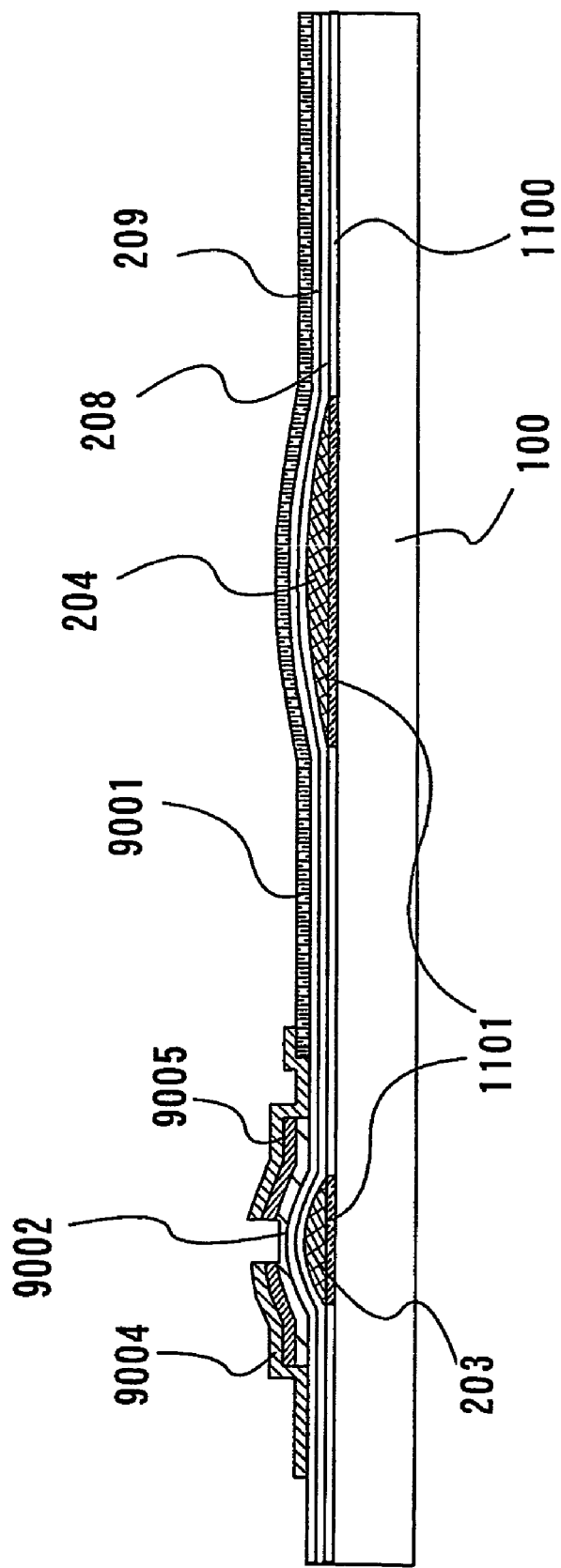
FIG. 31 is a cross-sectional view showing a method for manufacturing a liquid crystal display device of the present invention.

The n-type semiconductor layer 9003 is etched using the source-drain wiring layers 9004 and 9005 as a mask to be separated without providing the insulating layer 214 to be a channel protection layer described with reference to FIG. 29C, and etching of the semiconductor layer is continued partway. Accordingly, such a TFT substrate for a liquid crystal panel as in FIG. 31 can also be formed.

As in Embodiment Mode 1, a liquid crystal panel can be formed by attaching a substrate provided with an insulating layer functioning as an alignment film and a conductive layer functioning as an opposite electrode to the TFT substrate manufactured in this embodiment mode with a spacer therebetween and by providing the space with a liquid crystal material.

One feature of this embodiment mode is that pretreatment for improving adhesion as described in Embodiment Mode 1 is performed on a formation face in either of the steps before and after forming a conductive material by a droplet discharge method in manufacturing a liquid crystal display device.

Embodiment Mode 5

A method for manufacturing a liquid crystal display device including a thin film transistor in which an n-type semiconductor layer is electrically connected with a pixel electrode directly and through a drain wiring is described in this embodiment mode.

Figure 32A:
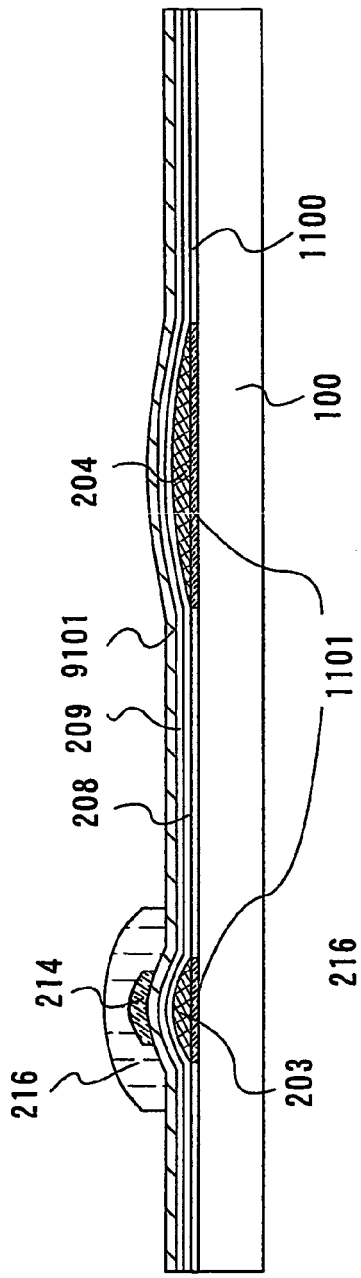
FIGS. 32A to 32D are cross-sectional views showing a method for manufacturing a liquid crystal display device of the present invention.
Figure 32B:
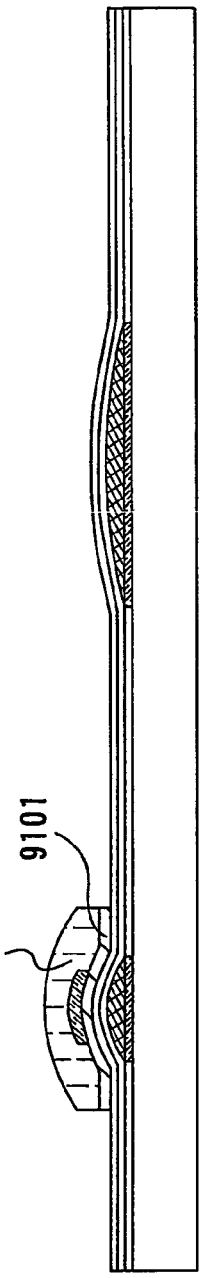
Figure 32C:
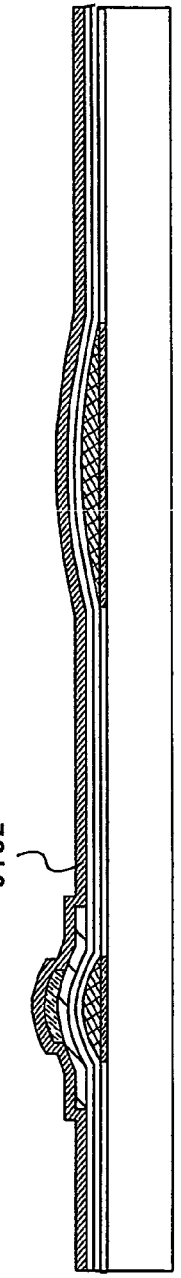
Figure 32D:
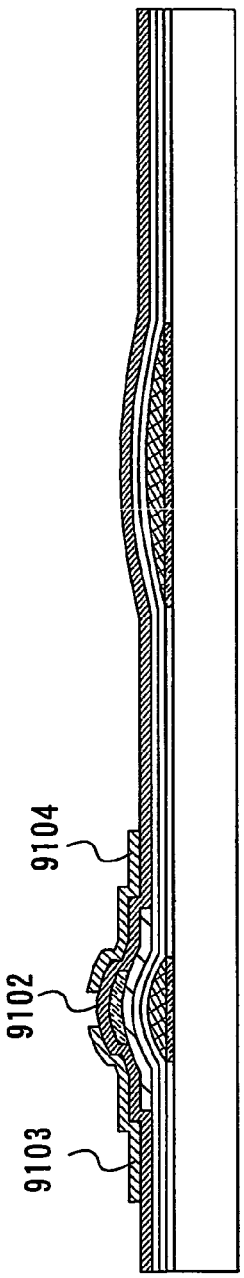
Figure 33A:
FIGS. 33A and 33B are cross-sectional views showing a method for manufacturing a liquid crystal display device of the present invention.
Figure 33B:
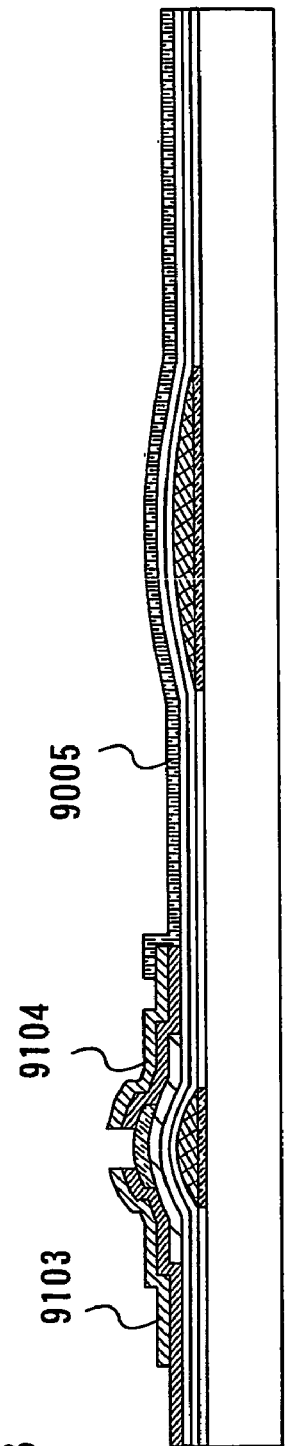

After a gate electrode layer 203, a capacitor wiring layer 204, an insulating layer 208, and an insulating layer 209 are formed as described in Embodiment Mode 1, a semiconductor layer 9101 and an insulating layer 214 is formed (FIG. 32A). Naturally, these may be formed by a droplet discharge method after such base pretreatment as described in Embodiment Mode 1 is performed. Thereafter, a mask 216 for patterning the semiconductor layer 9101 is formed by a droplet discharge method (FIG. 32A), and the semiconductor layer 9101 is patterned using the mask 216 (FIG. 32B). Subsequently, the mask is removed, and an n-type semiconductor layer 9102 is formed (FIG. 32C). Then, a composition including a conductive material is discharged by a droplet discharge method to form source-drain wirings 9103 and 9104 (FIG. 32D). The n-type semiconductor layer 9102 is separated and patterned using the source-drain wirings 9103 and 9104 (FIG. 33A). A composition including a conductive material is discharged by a droplet discharge method to form a pixel electrode 9105 to be in contact the drain wiring layer 9004 (FIG. 33B). The pixel electrode 9105 may be formed by forming a predetermined pattern of a composition including indium tin oxide (ITO), indium tin oxide containing silicon oxide (ITSO), zinc oxide (ZnO), tin oxide ($SnO_2$), or the like with a droplet discharge method and by baking the pattern.

As in Embodiment Mode 1, a liquid crystal panel can be formed by attaching a substrate provided with an insulating layer functioning as an alignment film and a conductive layer functioning as an opposite electrode to the TFT substrate manufactured in this embodiment mode with a spacer therebetween and by providing the space with a liquid crystal material.

One feature of this embodiment mode is that pretreatment for improving adhesion as described in Embodiment Mode 1 is performed on a formation face in either of the steps before and after forming a conductive material by a droplet discharge method in manufacturing a liquid crystal display device.

Embodiment Mode 6

A method for manufacturing a liquid crystal display device including a staggered type thin film transistor is described in this embodiment mode.

A composition including a conductive material is discharged by a droplet discharge method to a substrate on which base treatment is performed as described in Embodiment Mode 1 to form source-drain wiring layers 9201 and 9202 (FIG. 34A). Subsequently, a pixel electrode 9203 is formed by discharging a composition including a conductive material (FIG. 34B). In forming the pixel electrode, the pixel electrode can be formed with good adhesion by performing similar treatment to base treatment on a substrate described in Embodiment Mode 1 on the drain wiring layer 9202 or the substrate 100. An n-type semiconductor layer 9204 is formed subsequently (FIG. 34C), and then, a mask 9205 for patterning the n-type semiconductor layer 9204 is formed by a droplet discharge method (FIG. 34D). The n-type semiconductor layer 9204 is separated and patterned using the mask (FIG. 34E). A semiconductor film 9206 and two layers of gate insulating fills 9207 and 9208 are formed (FIGS. 34F and 34G). Of course, the gate insulating film may have a three-layer structure as in Embodiment Mode 1. Thereafter, a composition including a conductive material is discharged to the gate insulating film 9208 located over a portion where the n-type semiconductor layer is separated to form a pixel electrode 9209 (FIG. 34H). A mask 9210 for patterning the semiconductor layer 9206 is formed by a droplet discharge method (FIG. 34I), and the gate insulating films 9207 and 9208, and the semiconductor layer 9206 are etched and patterned (FIG. 34J).

Figure 38:
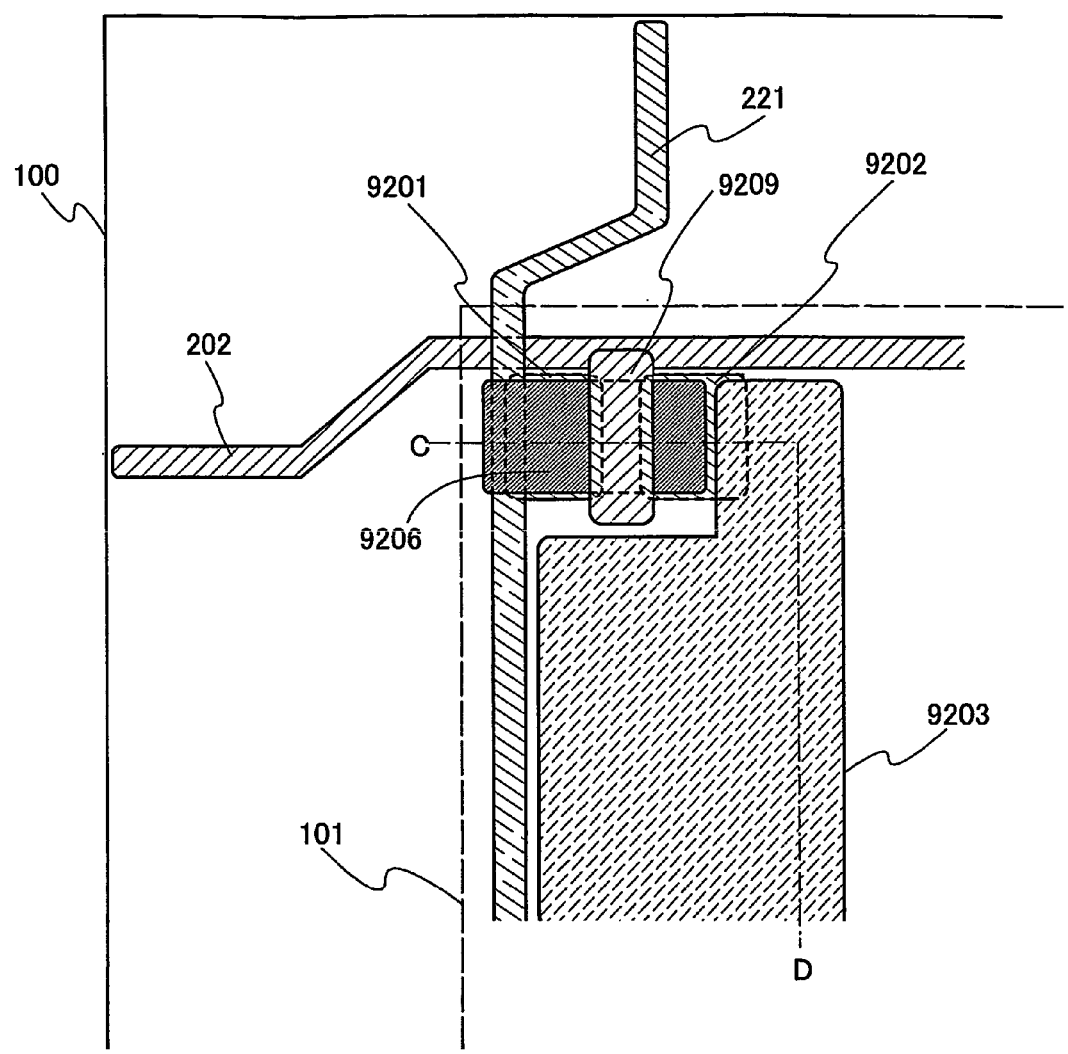
FIG. 38 is a top view showing a method for manufacturing a liquid crystal display device of the present invention.

Through the above-mentioned steps, a TFT substrate for a liquid crystal panel can be formed. FIG. 38 is a top view of the TFT substrate for a liquid crystal panel. FIG. 34J is a cross-sectional view of the TFT substrate for a liquid crystal panel, taken along a dotted line C-D in FIG. 38.

A liquid crystal panel can be formed by attaching a substrate provided with an insulating layer functioning as an alignment film and a conductive layer functioning as an opposite electrode to the TFT substrate manufactured in this embodiment mode with a spacer therebetween as in Embodiment Mode 1 and by providing the space with a liquid crystal material.

One feature of this embodiment mode is that pretreatment for improving adhesion as described in Embodiment Mode 1 is performed on a formation face before and/or after forming in any one of the steps of forming a conductive material by a droplet discharge method in manufacturing a liquid crystal display device.

Embodiment Mode 7

A method for manufacturing a liquid crystal display device including a staggered type thin film transistor having a structure in which a drain wiring overlaps a pixel electrode is described in this embodiment mode.

Figure 35A:
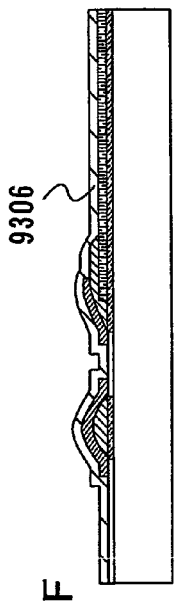
FIGS. 35A to 35J are cross-sectional views showing a method for manufacturing a liquid crystal display device of the present invention.
Figure 35B:
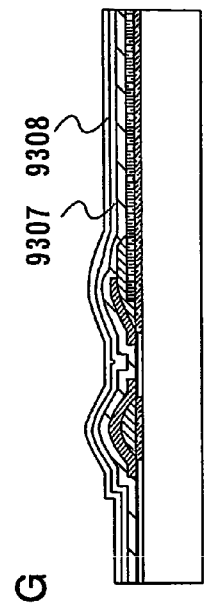
Figure 35C:
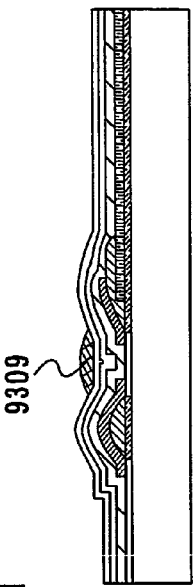
Figure 35D:
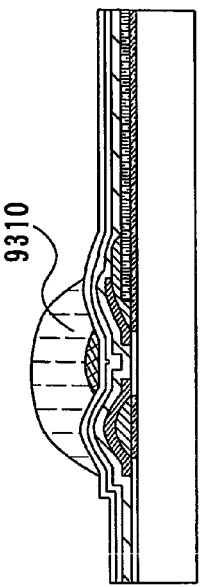
Figure 35E:
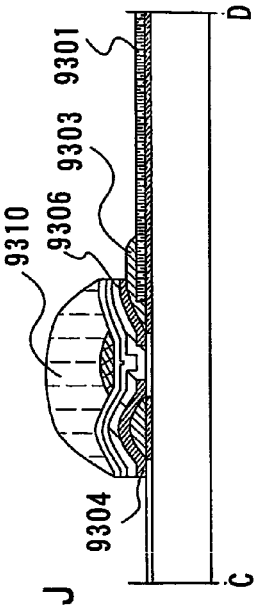
Figure 35F:
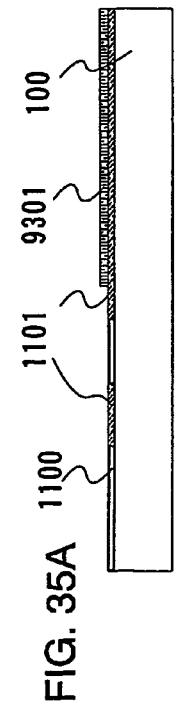
Figure 35G:
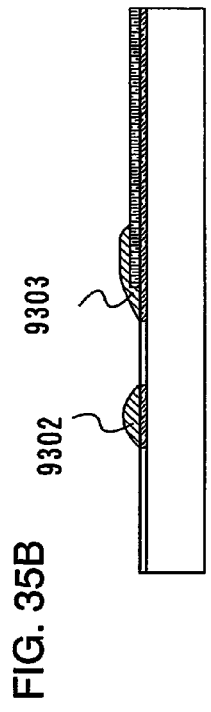
Figure 35H:
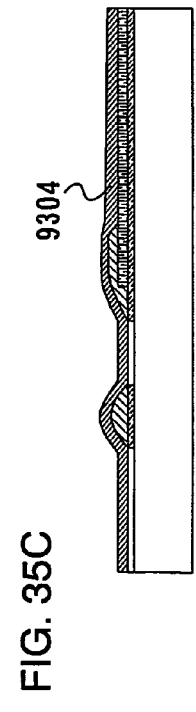
Figure 35I:
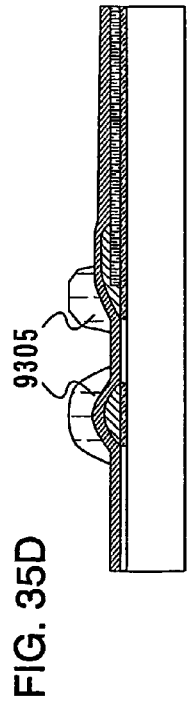
Figure 35J:
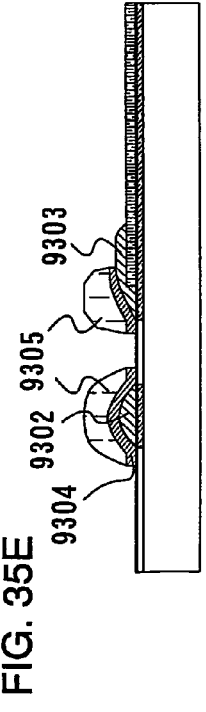

As described in Embodiment Mode 1, a composition including a conductive material is discharged by a droplet discharge method to a substrate on which base treatment is performed to form a pixel electrode 9301 (FIG. 35A). Source-drain wiring layers 9302 and 9303 are formed in the same manner (FIG. 35B). The drain wiring layer is selectively formed to partly overlap the pixel electrode. Thereafter, an n-type semiconductor layer 9304 is formed (FIG. 35C), and a mask 9305 for separating and patterning the n-type semiconductor layer is formed by a droplet discharge method (FIG. 35D). The n-type semiconductor layer 9304 is separated and patterned using the mask (FIG. 35D). A semiconductor layer 9306 and two layers of gate insulating films 9307 and 9308 are formed (FIGS. 35F and 35G). Of course, the gate insulating film may have a three-layer structure as in Embodiment Mode 1. Thereafter, a composition including a conductive material is discharged to the gate insulating film 9308 located over a portion where the n-type semiconductor is separated to form a gate electrode 9309 (FIG. 35H). A mask 9310 for patterning the semiconductor layer 9306 is formed by a droplet discharge method (FIG. 35I), and the gate insulating films 9307 and 9308 and the semiconductor layer 9306 are etched and patterned. Thus, a TFT substrate for a liquid crystal panel is formed (FIG. 35J).

Figure 39:
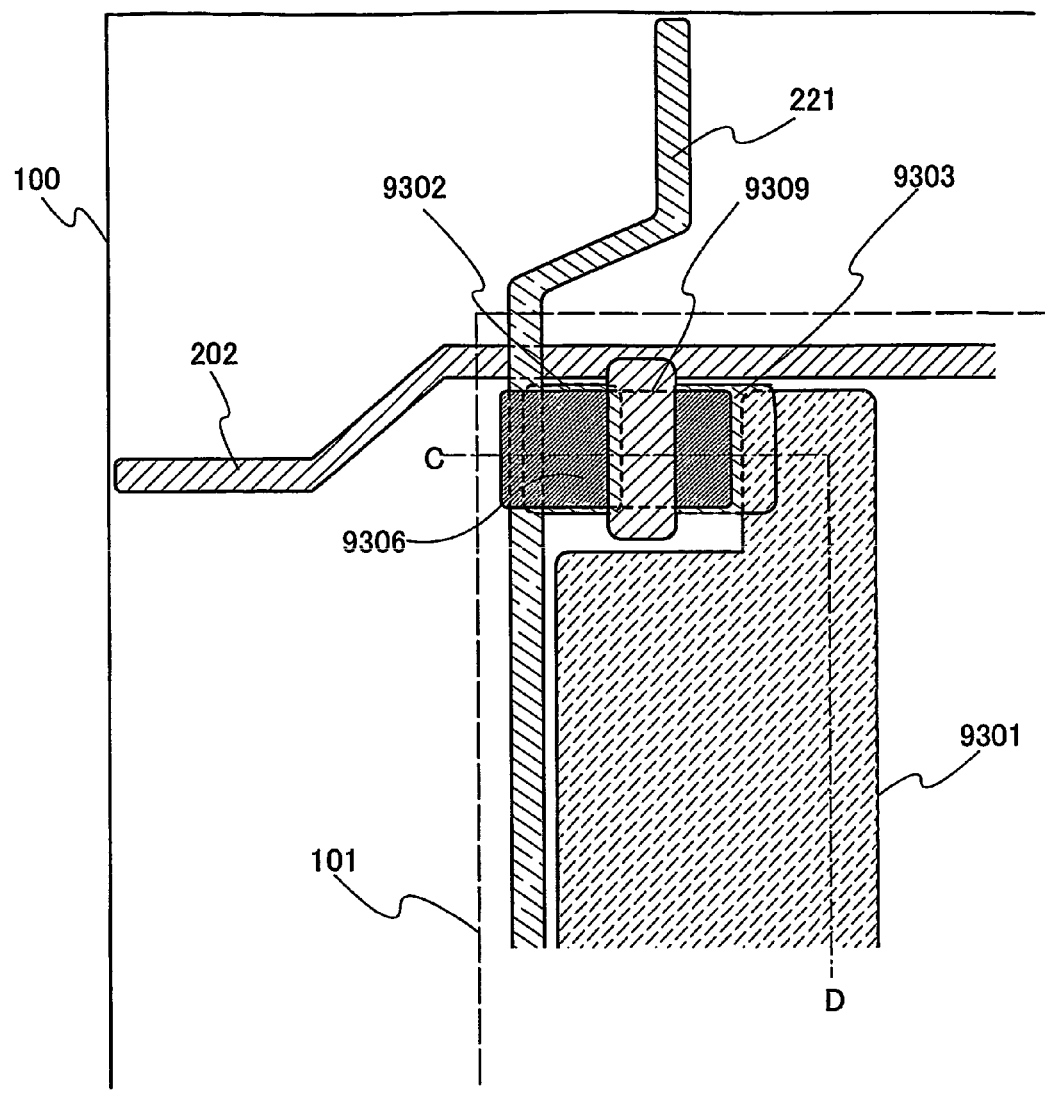
FIG. 39 is a top view showing a method for manufacturing a liquid crystal display device of the present invention.

Through the above-mentioned steps, the TFT substrate for a liquid crystal panel can be formed. FIG. 39 is a top view of the TFT substrate for a liquid crystal panel. FIG. 35J is a cross-sectional view of the TFT substrate for a liquid crystal panel, taken along a dotted line C-D in FIG. 39.

A liquid crystal panel can be formed by attaching a substrate provided with an insulating layer functioning as an alignment film and a conductive layer functioning as an opposite electrode to the TFT substrate manufactured in this embodiment mode with a spacer therebetween as in Embodiment Mode 1 and by providing the space with a liquid crystal material.

One feature of this embodiment mode is that pretreatment for improving adhesion as described in Embodiment Mode 1 is performed on a formation face in either of the steps before and after forming a conductive material by a droplet discharge method in manufacturing a liquid crystal display device.

Embodiment Mode 8

FIGS. 36A and 36B are cross-sectional views of a TFT substrate for a liquid crystal display device which is manufactured without providing an n-type semiconductor in a manufacturing method described in Embodiment Modes 6 and 7.

In the case of manufacturing a TFT substrate for a liquid crystal display panel shown in FIG. 36A, steps described with reference to FIGS. 34C, 34D, and 34E can be omitted and steps of manufacturing a liquid crystal display device can be simplified.

In the case of manufacturing a TFT substrate for a liquid crystal display panel shown in FIG. 36B, steps described with reference to FIGS. 35C, 35D, and 35E can be omitted and steps of manufacturing a liquid crystal display device can be simplified.

Embodiment 1

A scanning line side driver circuit can be formed over a substrate 100 as shown in FIG. 3 by forming a semiconductor layer of an SAS in a liquid crystal display panel manufactured by Embodiment Mode 1, Embodiment Mode 2, Embodiment Mode 3, Embodiment Mode 4, Embodiment Mode 5, Embodiment Mode 6, Embodiment Mode 7, or Embodiment Mode 8.

Figure 20:
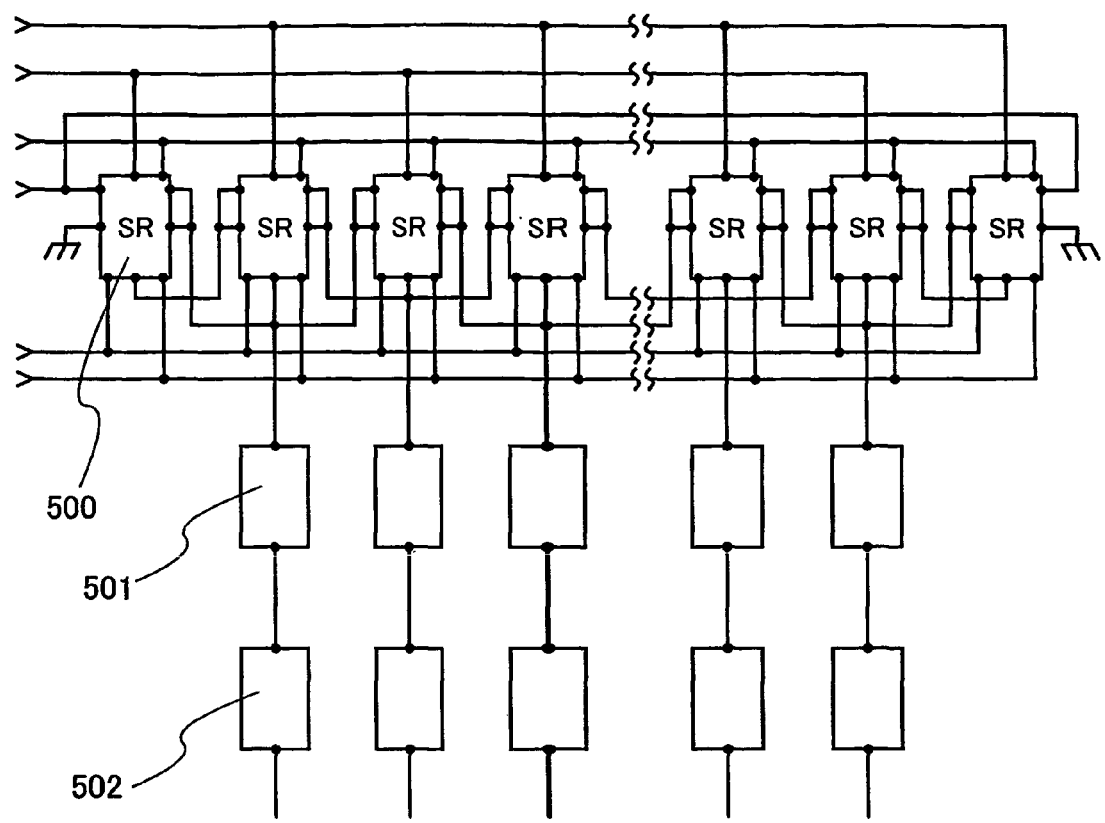
FIG. 20 shows a circuit structure in the case where a scanning line side driver circuit includes a TFT in a liquid crystal display device of the present invention.

FIG. 20 is a block diagram of a scanning line side driver circuit including an n-channel type TFT using a SAS in which field effect mobility of from 1 $cm^2$/V·sec to 15 $cm^2$/V·sec is obtained.

A block denoted by reference numeral 500 in FIG. 20 corresponds to a pulse output circuit for outputting a sampling pulse for one stage, and a shift register includes n pulse output circuits. Reference numeral 501 denotes a buffer circuit, and a pixel 502 (corresponding to a pixel 102 in FIG. 3) is connected at the end thereof.

Figure 21:
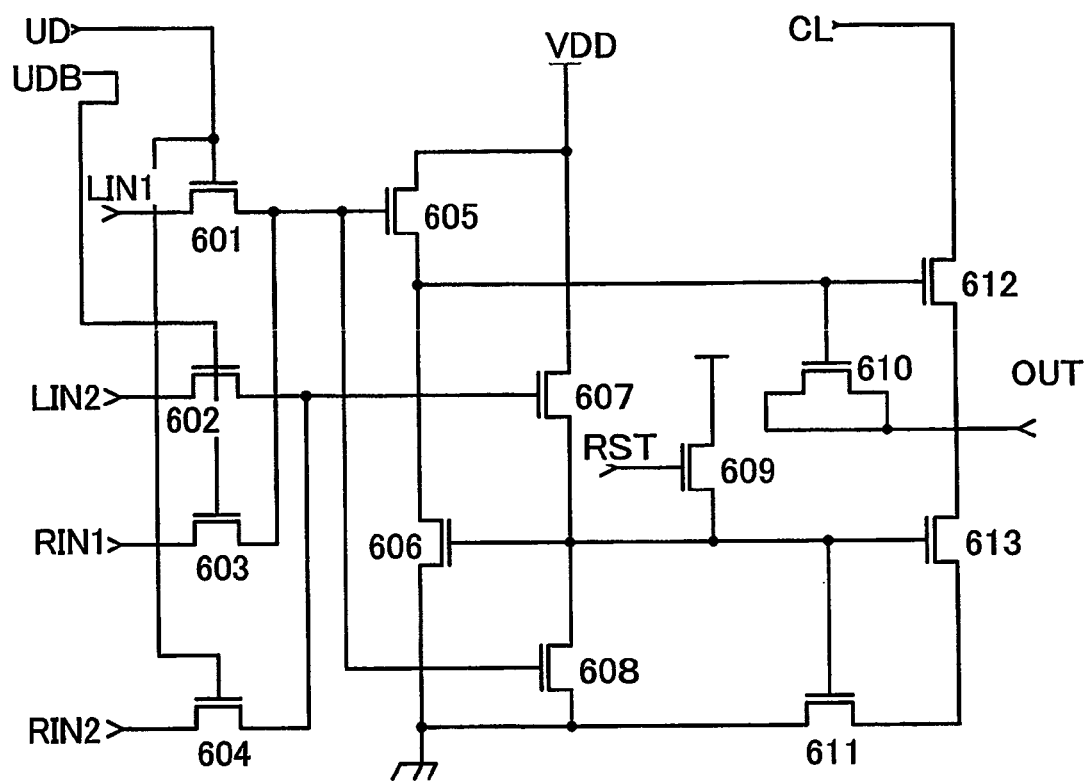
FIG. 21 shows a circuit structure in the case where a scanning line side driver circuit includes a TFT in a liquid crystal display device of the present invention (shift register circuit).

FIG. 21 shows a specific structure of the pulse output circuit 500, and the circuit includes n-channel type TFTs 601 to 613. The size of the TFTs may be determined in consideration of operating characteristics of the n-channel type TFTs using a SAS. When a channel length is set to be 8 μm, for example, a channel width can be set ranging from 10 μm to 80 μm.

Figure 22:
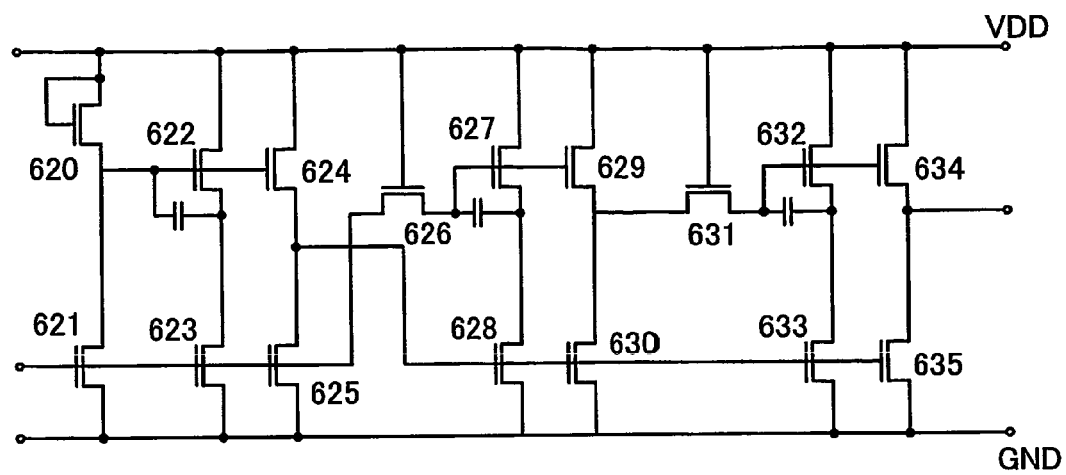
FIG. 22 shows a circuit structure in the case where a scanning line side driver circuit includes a TFT in a liquid crystal display device of the present invention (buffer circuit).

FIG. 22 shows a specific structure of the buffer circuit 501. The buffer circuit includes n-channel type TFTs 620 to 635 in the same manner. The size of the TFTs may be determined in consideration of operating characteristics of the n-channel type TFTs using a SAS. When a channel length is set to be 10 μm, for example, a channel width can be set ranging from 10 μm to 1800 μm.

Figure 12:
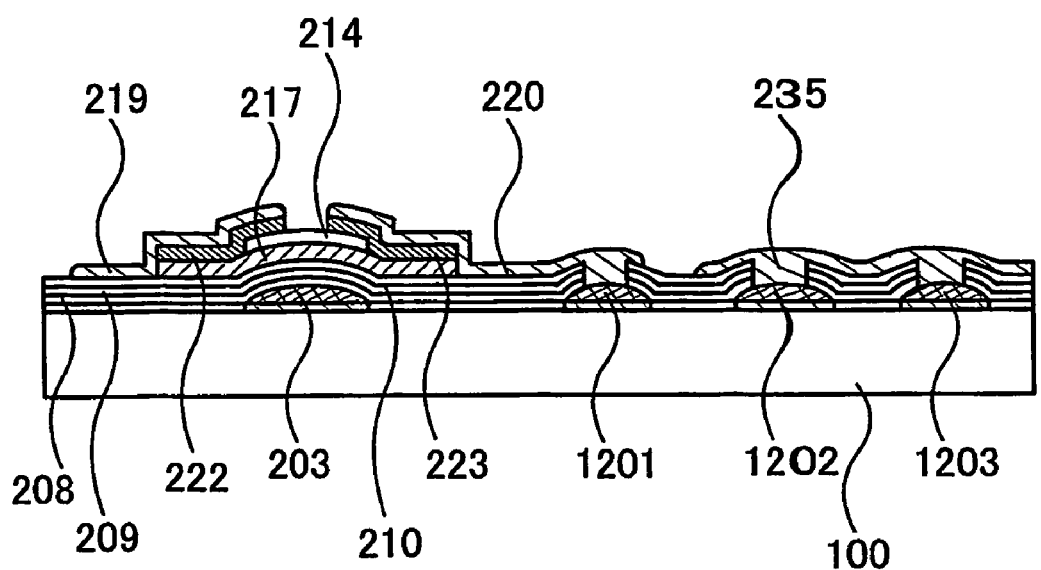
FIG. 12 is a cross-sectional view showing a method for manufacturing a liquid crystal display device of the present invention.

It is necessary to connect the TFTs with each other by wirings to realize such a circuit, and FIG. 12 shows a structural example of wirings in that case. FIG. 12 shows a state in which a gate electrode layer 203, a gate insulating layer (lamination body of three layers of an insulating layer 208 made of silicon nitride, an insulating layer 209 made of silicon oxide, and an insulating layer 210 made of silicon nitride), a semiconductor layer 217 made of a SAS, an insulating layer 214 for forming a channel protection layer, n-type semiconductor layers 222 and 223 for forming a source and a drain, and source-drain wirings 219 and 220 are formed as in Embodiment Mode 1. In this case, connection wiring layers 1201, 1202, and 1203 are formed over the substrate 100 in the same step as that of the gate electrode layer 203. Then, the gate insulating layer is partly etched so that the connection wiring layers 1201, 1202, and 1203 are exposed. Various kinds of circuits can be realized by appropriately connecting the TFTs by the source-drain wiring layers 219 and 220 and a connection wiring layer 235 formed in the same step.

Embodiment 2

Figure 26:
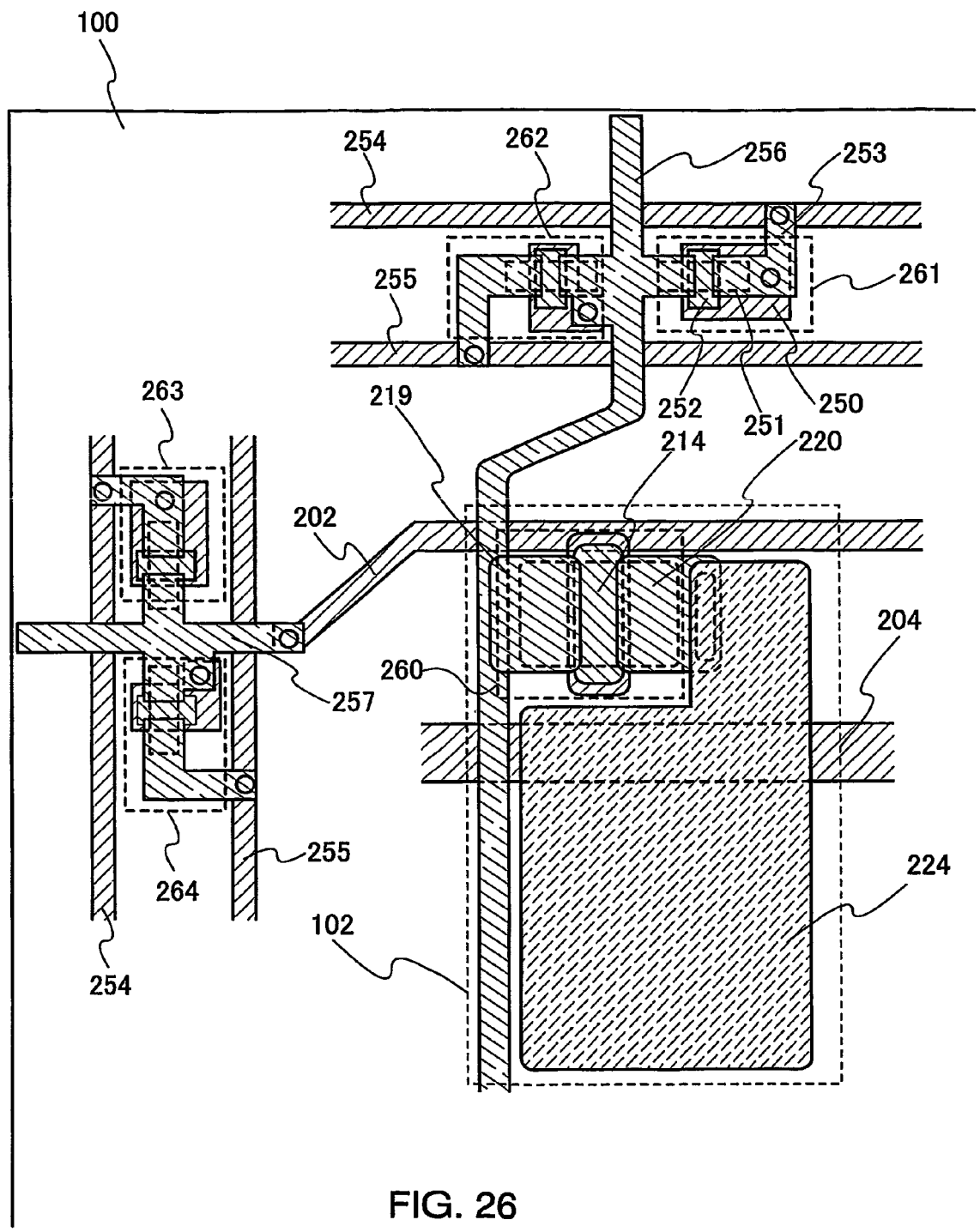
FIG. 26 is a top view showing a liquid crystal display device of the present invention.

One mode in which a scanning line side input terminal portion and a signal line side input terminal portion is provided with a protection diode is described with reference to FIG. 26. A pixel 102 is provided with a TFT 260 in FIG. 26. This TFT has a similar structure to that in Embodiment Mode 1.

Figure 27:
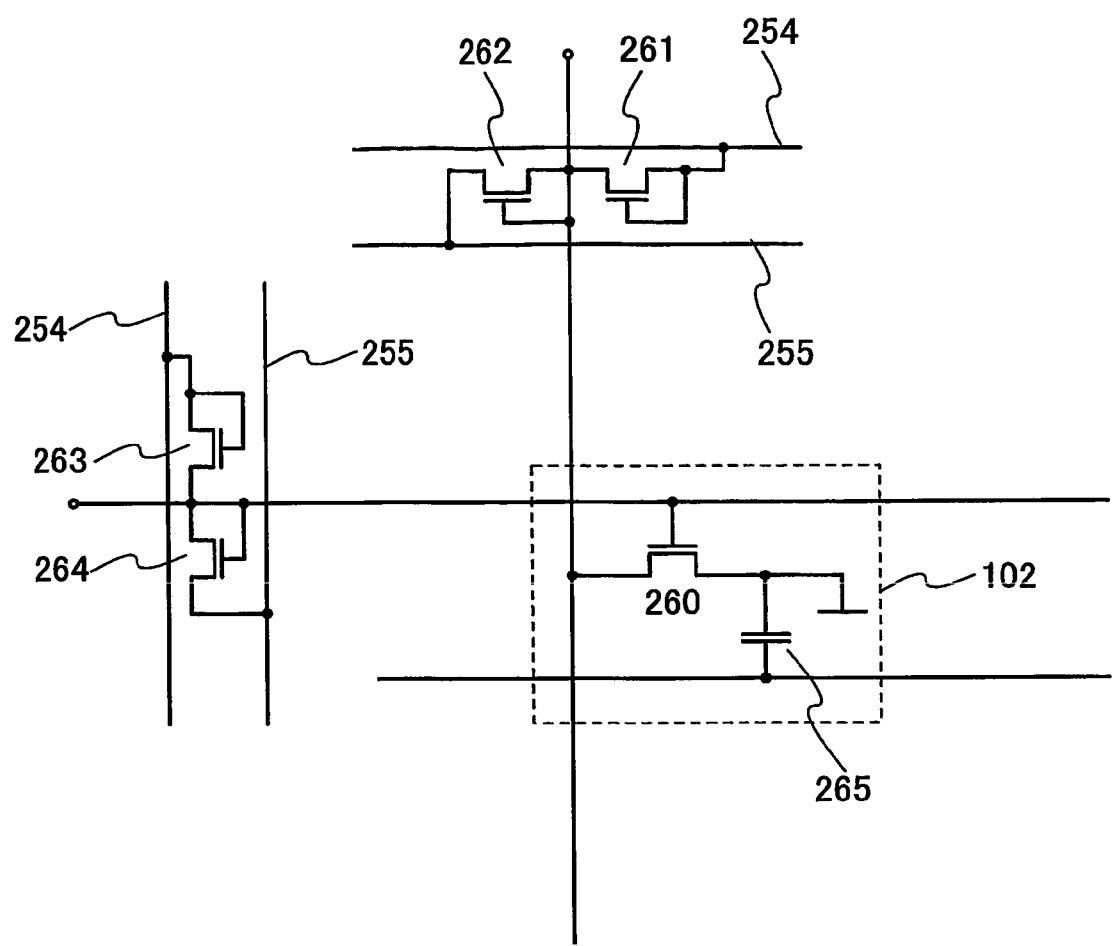
FIG. 27 is an equivalent circuit diagram of a liquid crystal display device shown in FIG. 26.

The signal line side input terminal portion is provided with protection diodes 261 and 262. These protection diodes are manufactured in a similar step to that of the TFT 260 and operate as diodes by connecting a gate with either a drain or a source. FIG. 27 shows an equivalent circuit diagram of the top view shown in FIG. 26. Note that, reference number 256 denotes a signal wiring layer.

The protection diode 261 includes a gate electrode layer 250, a semiconductor layer 251, a channel protection insulating layer 252, and a wiring layer 253. The protection diode 262 also has the same structure. Common potential lines 254 and 255 connected to this protection diode are formed in the same layer as the gate electrode layer. Therefore, it is necessary to form a contact hole in the gate insulating layer to electrically connect to the wiring layer 253.

A mask layer may be formed by a droplet discharge method and an etching process may be performed to form a contact hole in the gate insulating layer. In this case, when an etching process by atmospheric pressure discharge is applied, a local discharge process is also possible, and it is unnecessary to form a mask layer over an entire surface of a substrate.

The scanning line side input terminal portion is provided with protection diodes 263 and 264, and capacitor element 265. Note that the position of disposing a protection diode is not limited to this embodiment mode and can be provided between a driver circuit and a pixel as shown in FIG. 3.

Embodiment 3

A mode of mounting a driver circuit on a liquid crystal display panel manufactured by Embodiment Mode 1, Embodiment Mode 2, Embodiment Mode 3, Embodiment Mode 4, Embodiment Mode 5, Embodiment Mode 6, Embodiment Mode 7, or Embodiment Mode 8 is described with reference to FIGS. 17A and 17B, 18A and 18B, and 19A and 19B.

Figure 17A:
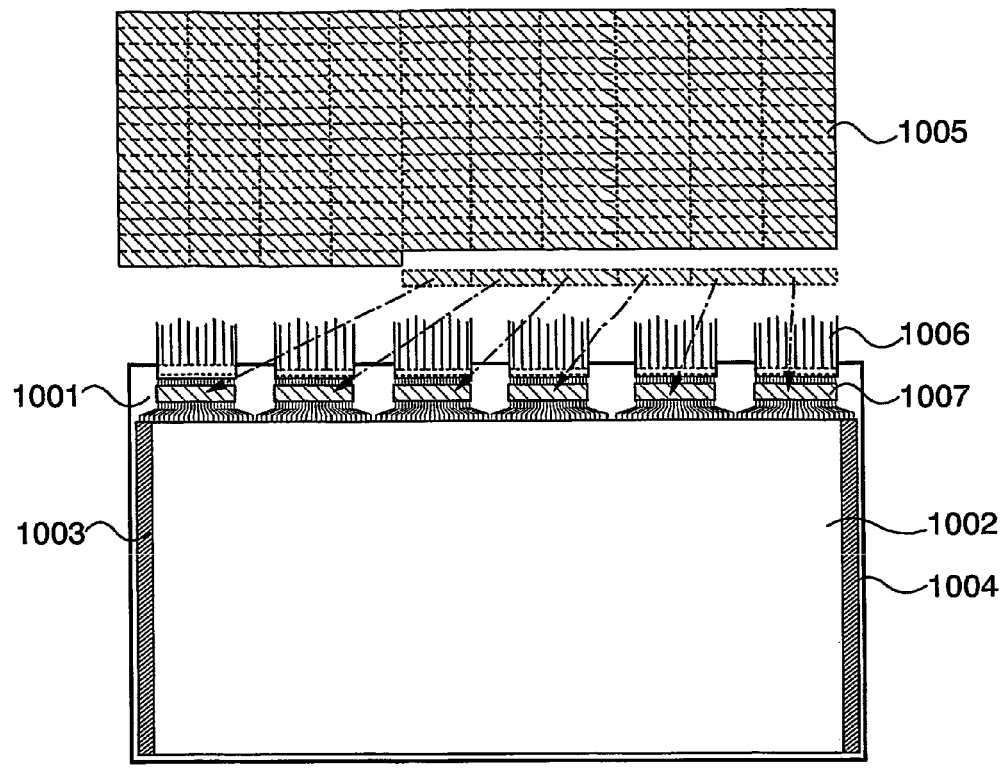
FIGS. 17A and 17B show a mounting method (COG method) of a driver circuit in a liquid crystal display device of the present invention.
Figure 17B:
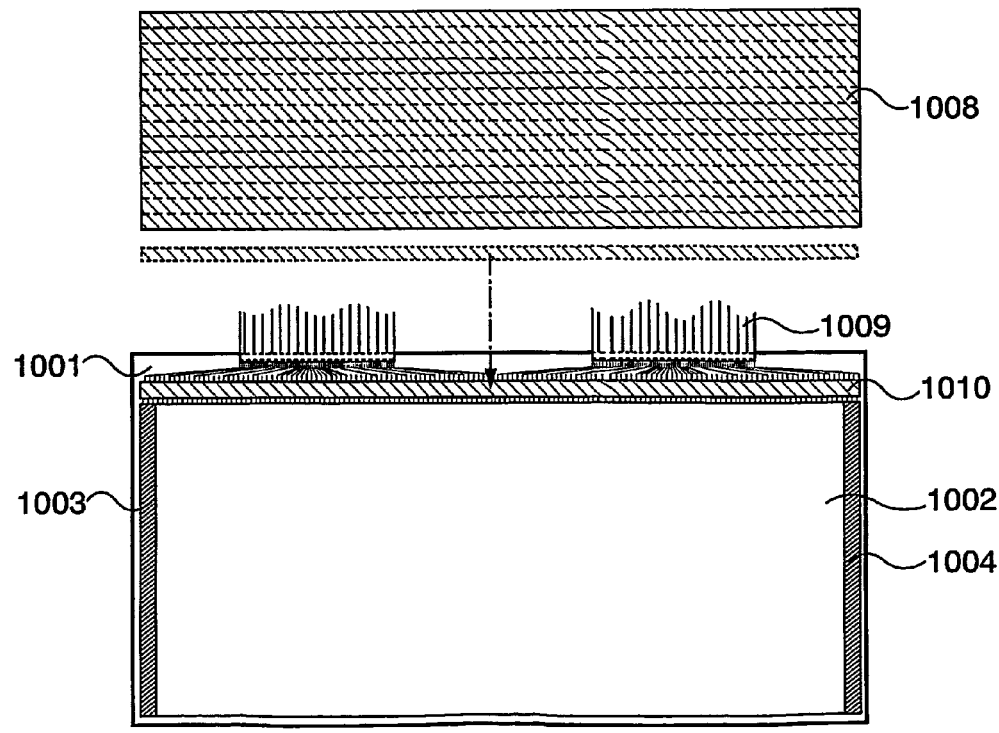

First, a display device employing a COG method is described with reference to FIGS. 17A and 17B. A pixel portion 1002 for displaying information such as characters and images and scanning line side driver circuits 1003 and 1004 are provided over a substrate 1001. Substrates 1005 and 1008 provided with a plurality of driver circuits are divided into rectangles, and the divided driver circuit (hereinafter referred to as an IC chip) is mounted on the substrate 1001. FIG. 17A shows a mode of mounting a plurality of IC chips 1007 and a tape 1006 on the end of the IC chips 1007. FIG. 17B shows a mode of mounting an IC chip 1010 and a tape 1009 at the end of the IC chip 1010.

Figure 18A:
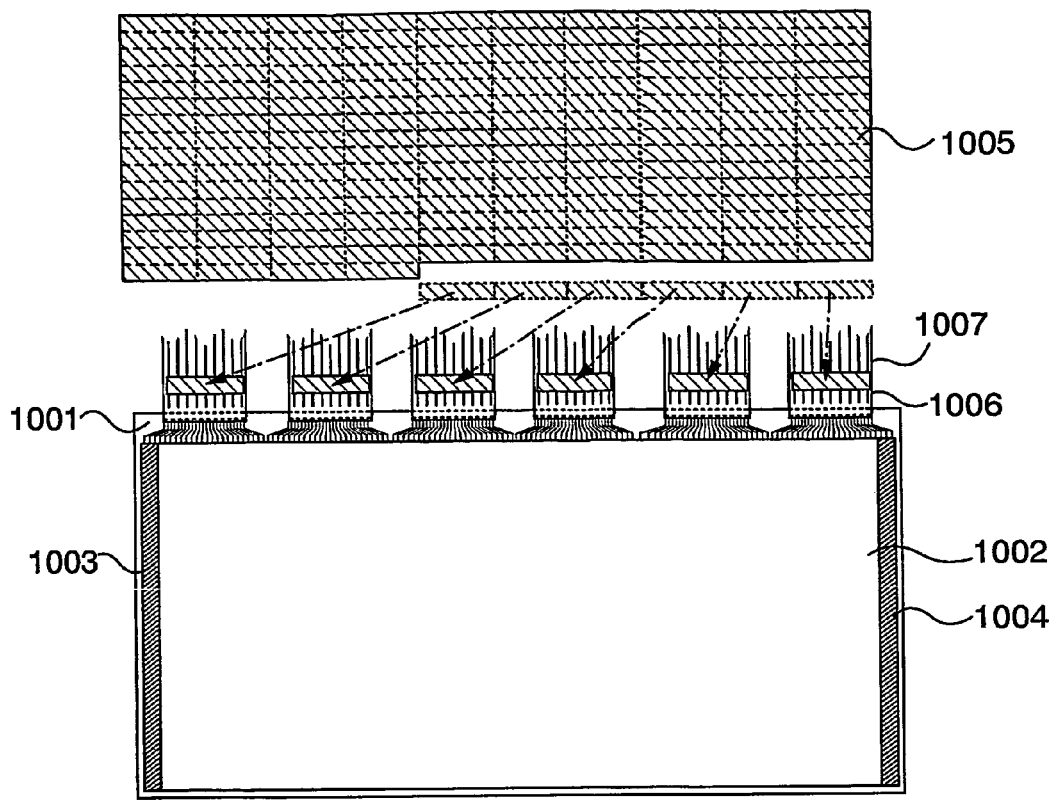
FIGS. 18A and 18B show a mounting method (TAB method) of a driver circuit in a liquid crystal display device of the present invention.
Figure 18B:
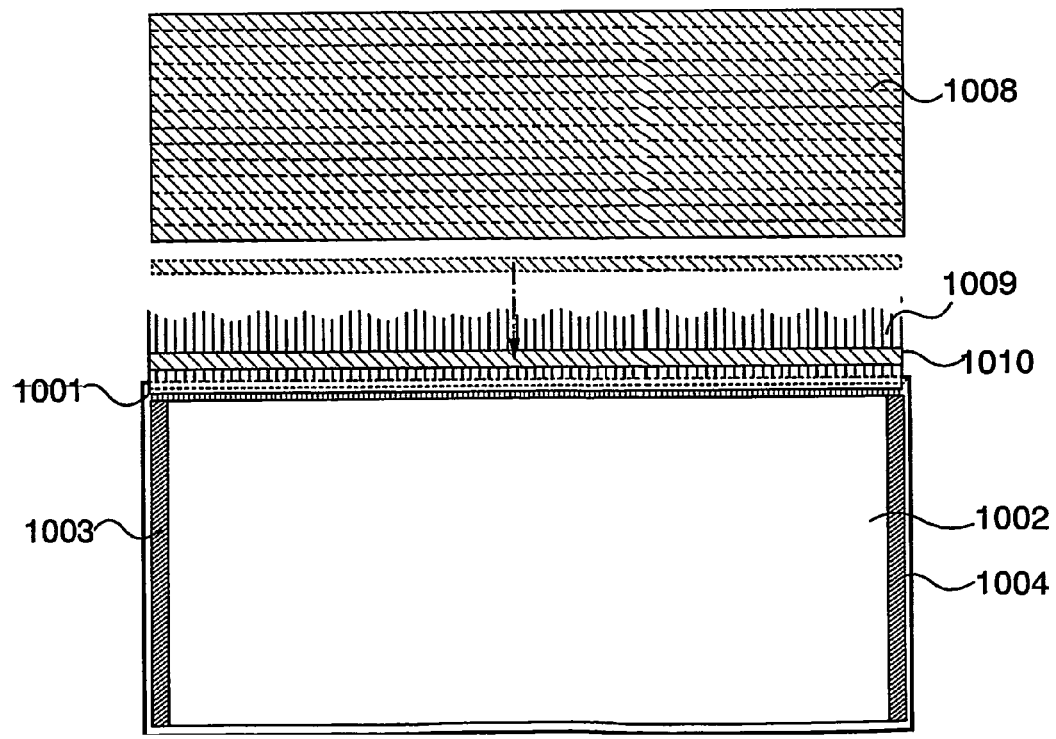

Next, a display device employing a TAB method is described with reference to FIGS. 18A and 18B. A pixel portion 1002 and scanning line side driver circuits 1003 and 1004 are provided over a substrate 1001. FIG. 18A shows a mode of attaching a plurality of tapes 1006 to the substrate 1001 and mounting IC chips 1007 on the tapes 1006. FIG. 18B shows a mode of attaching a tape 1009 to the substrate 1001 and mounting an IC chip 1010 on the tape 1009. In the case of employing the latter, a metal piece or the like for fixing the IC chip 1010 may be attached together in terms of a problem of intensity.

A plurality of the IC chips to be mounted on a liquid crystal display panel is preferably formed over the rectangular substrates 1005 and 1008 having a side of from 300 mm to 1000 mm or more in terms of improving productivity.

In other words, a plurality of circuit patterns including a driver circuit portion and an input-output terminal as a unit is formed over the substrates 1005 and 1008, and lastly, may be divided and taken out. In consideration of a side length of the pixel portion, the IC chip may be formed to be a rectangle having a long side of from 15 mm to 80 mm and a short side of from 1 mm to 6 mm as shown in FIGS. 17A and 18A. Alternatively, IC chip may be formed to have a long side length of adding a side length of the pixel portion 1002 to a side length of each driver circuit 1003 or 1004.

An advantage of an external dimension over an IC chip of a driver IC is a length of a long side. When an IC chip having a long side of from 15 mm to 80 mm is used, the number necessary for mounting in accordance with the pixel portion 1002 can be decreased. Therefore, a yield in manufacturing can be improved. When a driver IC is formed over a glass substrate, productivity is not harmed, without limitation due to a shape of a substrate used as a mother body. This is a great advantage as compared with the case of taking IC chips out of a circular silicon wafer.

In FIGS. 17A and 17B and FIGS. 18A and 18B, the IC chips 1007 or 1010 provided with a driver circuit is mounted on a region outside the pixel portion 1002. The IC chips 1007 or 1010 is a signal line side driver circuit. In order to form a pixel portion corresponding to RGB full color, 3072 signal lines are required for an XGA class and 4800 signal lines are required for a UXGA class. The signal lines formed in such a number are divided into several blocks on an edge portion of the pixel portion 1002 and are provided with a lead line. The signal lines are gathered in relation to a pitch of an output terminal of the IC chips 1007 or 1010.

The driver IC is preferably made of a crystalline semiconductor formed over a substrate. The crystalline semiconductor is preferably formed by being irradiated with continuous wave laser light. Therefore, a continuous wave solid laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility or response speed is favorable, and it is possible to further improve an operating frequency of an element than that of the conventional element. Therefore, high reliability can be obtained since there are few properties variations. Note that a channel-length direction of a transistor and a scanning direction of laser light may be directed in the same direction to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous wave laser. The channel length direction coincides with a flowing direction of a current, in other words, a direction in which an electric charge moves in a channel formation region. The thus manufactured transistor has an active layer including a polycrystalline semiconductor layer in which a crystal grain is extended in a channel direction, and this means that a crystal grain boundary is formed almost along a channel direction.

In order to perform laser crystallization, it is preferable to largely narrow down the laser light, and a beam spot thereof preferably has the same width of approximately from 1 mm to 3 mm as that of a short side of the driver ICs. In addition, in order to secure an enough and effective energy density for an object to be irradiated, an irradiation region of the laser light is preferably in a linear shape. As used herein, the term "linear" refers to not a line in a strict sense but a rectangle or an oblong with a large aspect ratio. For example, the linear shape refers to a rectangle or an oblong with an aspect ratio of 2 or more (preferably from 10 to 10000). Thus, it is possible to provide a method for manufacturing a display device in which productivity is improved by making a beam spot width of the laser light and length of a short side of the driver ICs the same length.

FIGS. 17A and 17B and FIGS. 18A and 18B show a mode in which the scanning line side driver circuit is integrally formed with the pixel portion and the driver IC is mounted as the signal line side driver circuit. However, the present invention is not limited to this mode, and the driver ICs may be mounted as both the scanning line side driver circuit and the signal line side driver circuit. In that case, it is preferable to differentiate specifications of the driver ICs to be used on the scanning line side and those on the signal line side.

In the pixel portion 1002, the signal line and the scanning line intersect to form a matrix and a transistor is arranged in accordance with each intersection. A TFT having an amorphous semiconductor or a semi-amorphous semiconductor as a channel portion is used as the transistor arranged in the pixel portion 1002 in the present invention. The amorphous semiconductor is formed by a method such as a plasma CVD method or a sputtering method. It is possible to form the semi-amorphous semiconductor at a temperature of 300° C. or less by a plasma CVD method. A film thickness necessary to form a transistor is formed in a short time even in the case of a non-alkaline glass substrate of an external size of, for example, 550 mm×650 mm. The feature of such a manufacturing technique is effective in manufacturing a large-area display device. In addition, a semi-amorphous TFT can obtain field effect mobility of from 2 cm²/V·sec to 10 cm²/V·sec by forming a channel formation region of a SAS. Therefore, this TFT can be used as a switching element of pixels and as an element constituting the scanning line side driver circuit. Thus, a liquid crystal display panel in which system-on-panel is realized can be manufactured.

Note that FIGS. 17A and 17B and FIGS. 18A and 18B are on the premise that the scanning line side driver circuit is also integrally formed over the substrate by using a TFT having a semiconductor layer formed of a SAS according to Embodiment Mode 3. In the case of using a TFT having a semiconductor layer formed of an AS, an driver IC may be mounted as both the scanning line side driver circuit and the signal line side driver circuit.

In that case, it is preferable to differentiate specifications of the driver ICs to be used on the scanning line side and on the signal line side. For example, a transistor constituting the scanning line side driver ICs is required to withstand a voltage of approximately 30 V; however, a drive frequency is 100 kHz or less and high-speed operation is not comparatively required. Therefore, it is preferable to set sufficiently long a channel-length (L) of the transistor constituting the scanning line side driver. On the other hand, a transistor of the signal line side driver ICs is required to withstand a voltage of only approximately 12 V; however, a drive frequency is around 65 MHz at 3 V and high-speed operation is required. Therefore, it is preferable to set a channel-length or the like of the transistor constituting a driver with a micron rule.

Figure 19A:
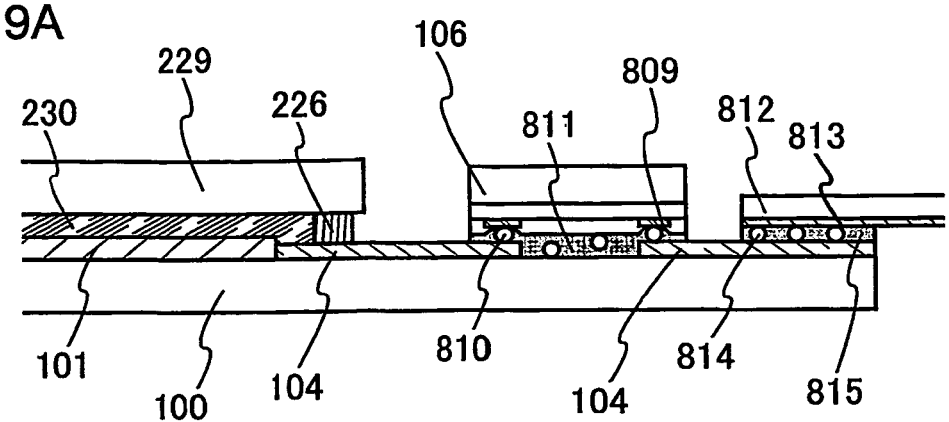
FIGS. 19A and 19B show a mounting method (COG method) of a driver circuit in a liquid crystal display device of the present invention.
Figure 19B:
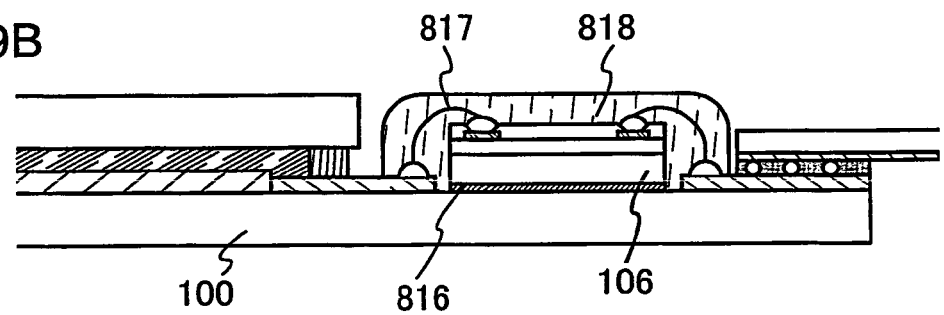

FIGS. 19A and 19B show a structure of mounting a driver IC by COG and show the case corresponding to the case of a liquid crystal display panel shown in FIG. 2. FIG. 19A shows a structure of mounting a driver IC 106 on a TFT substrate 100 by using an anisotropic conductive material. The TFT substrate 100 is provided with a pixel portion 101 and a signal line side input terminal 104 (the same applies to a scanning line input terminal 103). An opposite substrate 229 is attached to the TFT substrate 100 with a sealant 226, and a liquid crystal layer 230 is formed therebetween.

An FPC 812 is attached to the signal line side input terminal 104 with an anisotropic conductive material. The anisotropic conductive material includes a resin 815 and a conductive particle 814 having a diameter of from several tens of μm to several hundreds of μm whose surface is plated with Au or the like. The conductive particle 814 electrically connects the signal line side input terminal 104 to a wiring 813 provided on the FPC 812. The driver IC 106 is also attached to the TFT substrate 100 with an anisotropic conductive material and a conductive particle 810 mixed in a resin 811 electrically connects an input-output terminal 809 provided for the driver IC 106 to the signal line side input terminal 104.

As shown in FIG. 19B, a driver IC 106 may be fixed to a TFT substrate 100 with an adhesive 816, and an input-output terminal of the driver IC 106 may be connected to a lead line or a connection wiring with an Au wire 817. Then, sealing is performed with a sealing resin 818. Note that a method for mounting a driver IC is not particular limited and a known method such as a COG method, a wire bonding method, or a TAB method can be employed.

Height between the driver IC and the opposite substrate can be made almost the same by forming the driver IC to have the same thickness as that of the opposite substrate, which contributes to thinning of a display device as a whole. When both substrates are made of one material, thermal stress is not generated and characteristics of a circuit including a TFT are not harmed even when temperature change is caused in the display device. Furthermore, the number of driver ICs to be mounted on one pixel portion can be reduced by mounting a longer driver IC as described in this embodiment.

As described above, a driver circuit can be incorporated in a liquid crystal display panel.

Embodiment 4

Figure 23:
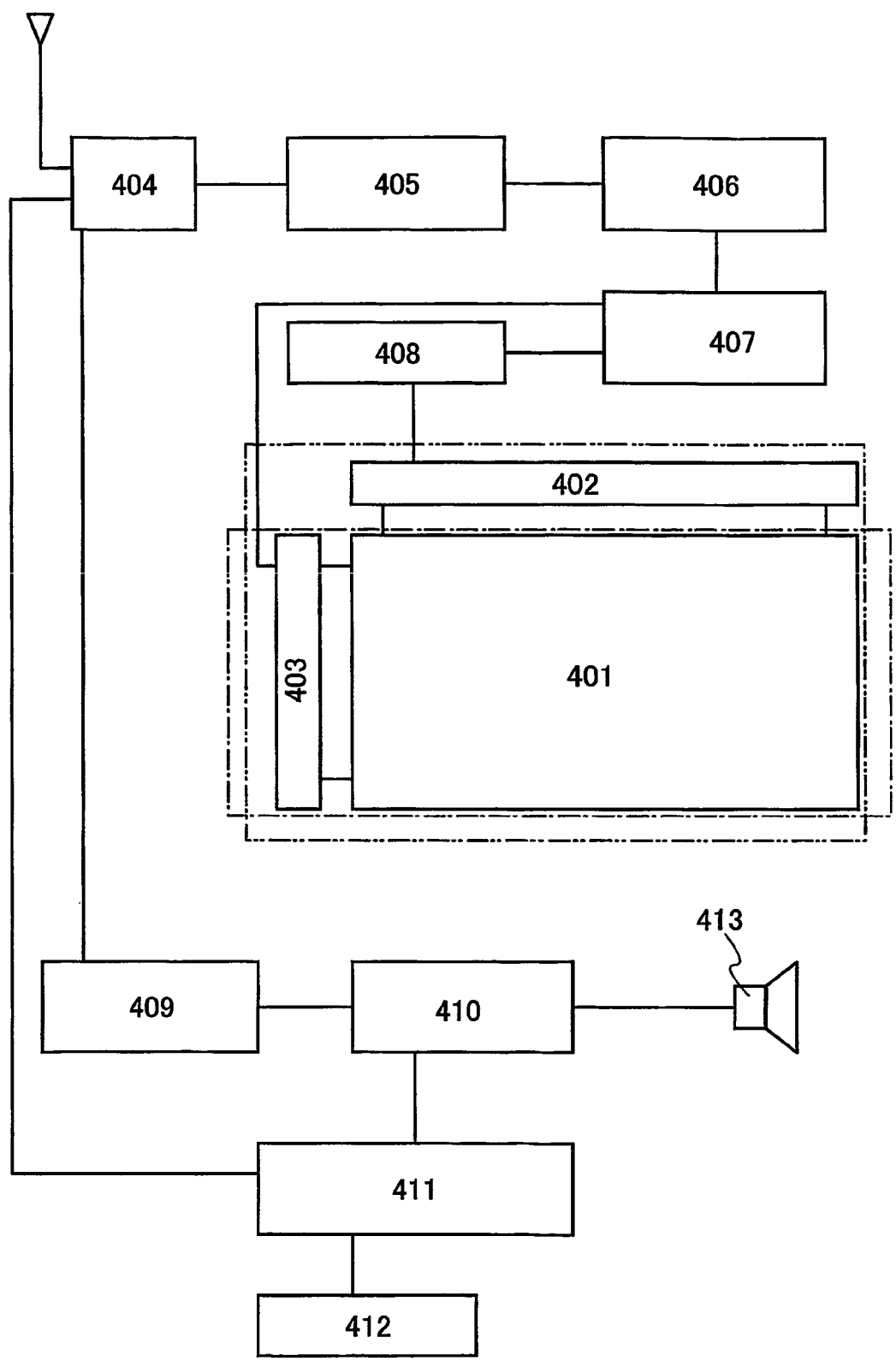
FIG. 23 is a block diagram showing a main structure of a liquid crystal TV set of the present invention.

A liquid crystal TV set can be completed using a liquid crystal display panel manufactured according to Embodiment 3. FIG. 23 is a block diagram of a main structure of a liquid crystal TV set. A liquid crystal display panel includes the case that only a pixel portion 401 is formed and a scanning line side driver circuit 403 and a signal line side driver circuit 402 are mounted by a TAB method as a structure shown in FIG. 1; that a scanning line side driver circuit 403 and a signal line side driver circuit 402 are mounted on a pixel portion 401 and a periphery thereof by a COG method as a structure shown in FIG. 2; and that a TFT is formed of a SAS, a pixel portion 401 and a scanning line side driver circuit 403 are integrally formed over a substrate, and a signal line side driver circuit 402 is separately mounted as a driver IC as a structure shown in FIG. 3. Any mode may be employed.

Another external circuit includes a video signal amplifier circuit 405 for amplifying a video signal among signals received by a tuner 404, a video signal processing circuit 406 for converting a signal to be outputted therefrom into a chrominance signal corresponding to each color of red, green, and blue, a control circuit 407 for converting the video signal into an input specification of a driver IC, and the like on an input side of a video signal. The control circuit 407 outputs a signal to both a scanning line side and a signal line side. In the case of digital driving, a signal dividing circuit 408 may be provided on the signal line side, and an input digital signal may be divided into m parts and be supplied.

An audio signal among signals received by the tuner 404 is transmitted to an audio signal amplifier circuit 409 and is supplied to a speaker 413 through an audio signal processing circuit 410 to be outputted. A control circuit 411 receives control information of a receiving station (receive frequency) or volume from an input portion 412 and transmits the signal to the tuner 404 and the audio signal processing circuit 410.

Figure 24:
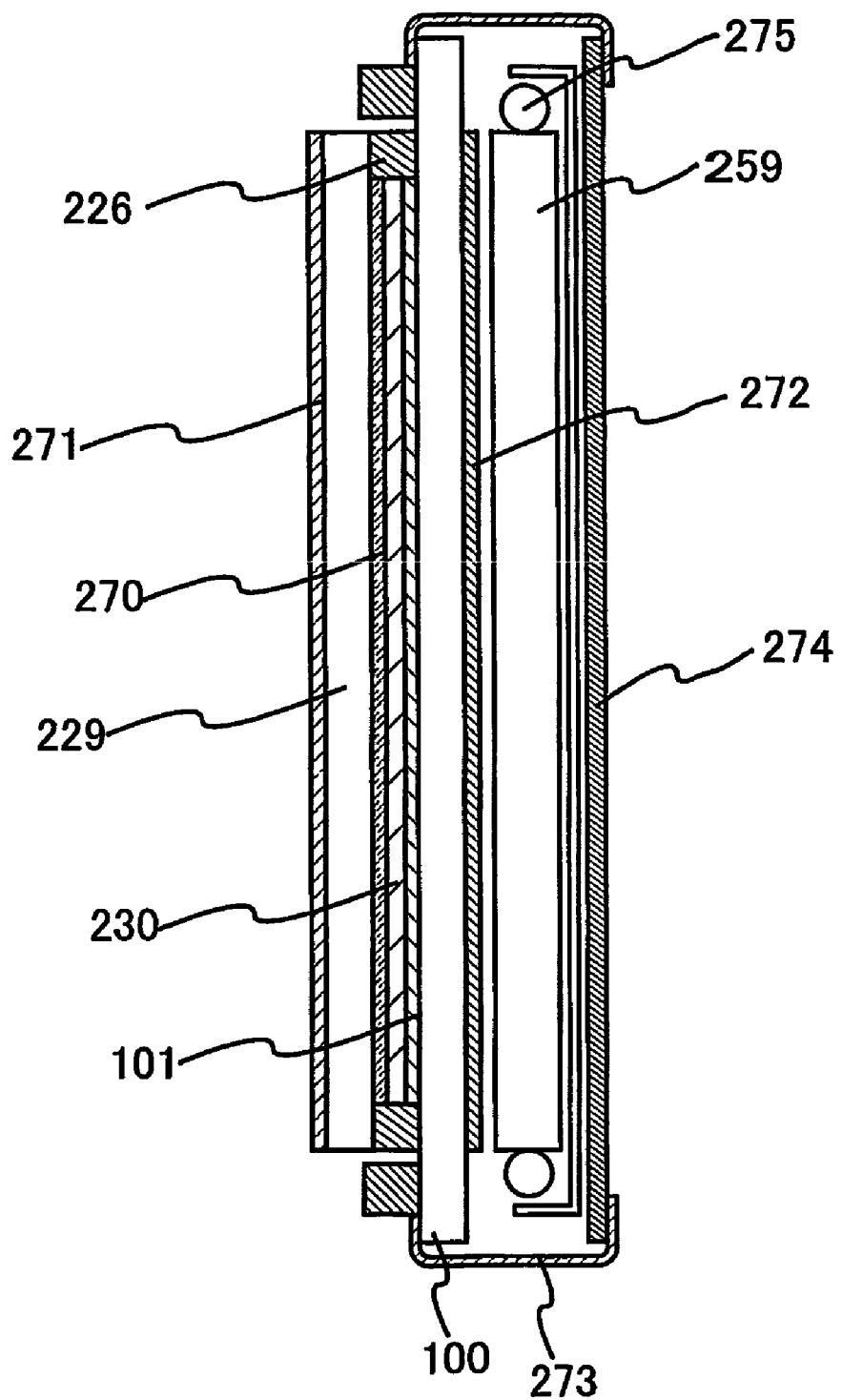
FIG. 24 shows a structure of a liquid crystal display module of the present invention.

FIG. 24 is an example of a liquid crystal display module. A TFT substrate 100 and an opposite substrate 229 are fixed to each other with a sealant 226, and a pixel portion 101 and a liquid crystal layer 230 are provided therebetween to form a display region. A colored layer 270 is required to perform color display. In the case of RGB system, a colored layer corresponding to each color of red, green, and blue is provided corresponding to each pixel. Polarizing plates 271 and 272 are provided outside the TFT substrate 100 and the opposite substrate 229. A light source includes a cold cathode fluorescent tube 275 and a light guiding plate 259; a circuit board 274 is connected to the TFT substrate 100 by a flexible wiring board 273; and an external circuit such as a control circuit or a power supply circuit is incorporated.

Figure 25:
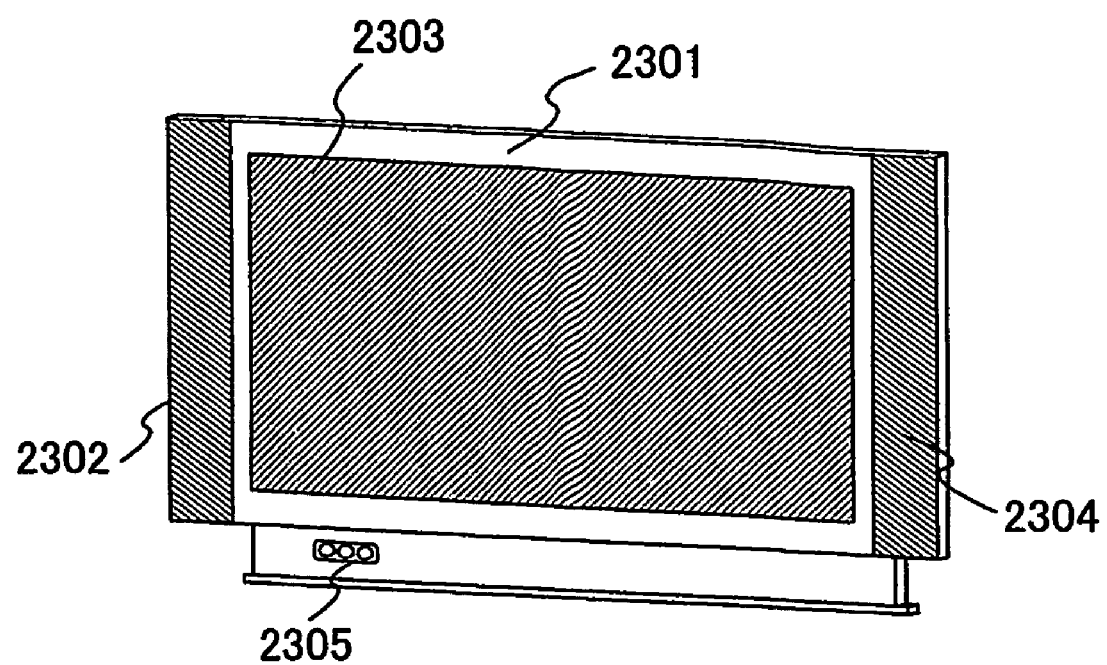
FIG. 25 shows a structure of a TV set completed according to the present invention.

FIG. 25 shows a state of a TV set which is completed by incorporating this liquid crystal display module into a chassis 2301. A display screen 2303 is formed by using the liquid crystal display module, and speakers 2302 and 2304, an operation switch 2305, and the like are provided as other attachments. Thus, a TV set can be completed according to the present invention.

Naturally, the present invention is not limited to the TV set and can be applied to various uses particularly as a large-area display medium such as an information display board in a train station, an airport, or the like, or an advertisement display board in the street as well as a monitor of a personal computer.

The invention claimed is:

1. A method for manufacturing a liquid crystal display device, comprising the steps of:
   forming a layer including a photocatalytic substance over a substrate;
   forming a gate electrode over the layer including the photocatalytic substance;
   forming a first insulating film to cover the gate electrode;
   forming a pixel electrode over the first insulating film;
   forming a first semiconductor layer over the first insulating film and the pixel electrode;
   forming a second insulating film over the first semiconductor layer to overlap the gate electrode;
   forming a second semiconductor layer to cover the second insulating film;
   patterning the first and second semiconductor layers into an island shape;
   forming source and drain wirings over the second semiconductor layer; and
   etching the second semiconductor layer using the source and drain wirings as a mask;
   wherein at least one of the gate electrode, the pixel electrode, and the source and drain wirings is formed by a droplet discharge method.

2. A method for manufacturing a liquid crystal display device, comprising the steps of:
   forming a layer including a photocatalytic substance over a substrate;
   forming a gate electrode over the layer including the photocatalytic substance;
   forming a first insulating film to cover the gate electrode;
   forming a first semiconductor layer over the first insulating film;
   forming a second insulating film over the first semiconductor layer to overlap the gate electrode;
   forming a second semiconductor layer to cover the second insulating film;
   pattering the first and second semiconductor layers into an island shape;
   forming source and drain wirings over the second semiconductor layer;
   etching the second semiconductor layer using the source and drain wirings as a mask;
   forming a third insulating film over the source and drain wirings and the first insulating film;
   forming an opening in third insulating film; and
   forming a pixel electrode over the third insulating film,
   wherein the pixel electrode is electrically connected with one of the source and drain wirings through the opening, and
   wherein at least one of the gate electrode, the source and drain wirings, and the pixel electrode is formed by a droplet discharge method.

3. A method for manufacturing a liquid crystal display device, comprising the steps of:
   forming a layer including a photocatalytic substance over a substrate;
   forming a gate electrode over the layer including the photocatalytic substance;
   forming a first insulating film to cover the gate electrode;
   forming a pixel electrode over the first insulating film;
   forming a first semiconductor layer over the first insulating film and the pixel electrode;
   forming a second insulating film over the first semiconductor layer to overlap the gate electrode;
   forming a second semiconductor layer to cover the second insulating film;
   patterning the first and the second semiconductor layers into an island shape;
   forming source and drain wirings over the second semiconductor layer;
   etching the second semiconductor layer using the source and drain wirings as a mask; and
   forming a third insulating film over the source and drain wirings and the pixel electrode,
   wherein the pixel electrode is electrically connected with one of the source and drain wirings, and
   wherein at least one of the gate electrode, the pixel electrode, and the source and drain wirings is formed by a droplet discharge method.

4. The method for manufacturing a liquid crystal display device according to claim 1, wherein the layer including the photocatalytic substance is a $TiO_2$ layer.

5. The method for manufacturing a liquid crystal display device according to claim 1, wherein the layer including the photocatalytic substance has hydrophilic property.

6. The method for manufacturing a liquid crystal display device according to claim 2, wherein the layer including the photocatalytic substance is a $TiO_2$ layer.

7. The method for manufacturing a liquid crystal display device according to claim 2, wherein the layer including the photocatalytic substance has hydrophilic property.

8. The method for manufacturing a liquid crystal display device according to claim 3, wherein the layer including the photocatalytic substance is a $TiO_2$ layer.

9. The method for manufacturing a liquid crystal display device according to claim 3, wherein the layer including the photocatalytic substance has hydrophilic property.

* * * * *